US012647088B2

(12) United States Patent
Takahashi

(10) Patent No.: US 12,647,088 B2
(45) Date of Patent: Jun. 2, 2026

(54) FILTER DEVICE

(71) Applicant: Murata Manufacturing Co., Ltd., Kyoto (JP)

(72) Inventor: Wataru Takahashi, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 128 days.

(21) Appl. No.: 18/486,631

(22) Filed: Oct. 13, 2023

(65) Prior Publication Data

US 2024/0146276 A1 May 2, 2024

(30) Foreign Application Priority Data

Nov. 2, 2022 (JP) ................................. 2022-176614

(51) Int. Cl.
| | |
|---|---|
| *H03H 7/01* | (2006.01) |
| *H01F 17/00* | (2006.01) |
| *H01P 1/203* | (2006.01) |
| *H01P 3/08* | (2006.01) |
| *H05K 1/11* | (2006.01) |

(52) U.S. Cl.
CPC ....... *H03H 7/0115* (2013.01); *H01F 17/0013* (2013.01); *H01P 1/20345* (2013.01); *H01P 3/082* (2013.01); *H01P 3/088* (2013.01); *H05K 1/115* (2013.01)

(58) Field of Classification Search
CPC ...... H01P 1/20345; H01P 3/082; H01P 3/088; H03H 7/0115

USPC ................................... 333/202–204, 236–238
See application file for complete search history.

(56) References Cited

U.S. PATENT DOCUMENTS

| | | | |
|---|---|---|---|
| 2010/0277255 A1* | 11/2010 | Matsushita | .............. H03H 7/09 333/175 |
| 2019/0220722 A1 | 7/2019 | Matsubara | |
| 2020/0235714 A1 | 7/2020 | Jeong et al. | |

FOREIGN PATENT DOCUMENTS

| | | |
|---|---|---|
| JP | 2020-115616 A | 7/2020 |
| WO | 2018/062119 A1 | 4/2018 |

* cited by examiner

*Primary Examiner* — Rakesh B Patel
(74) *Attorney, Agent, or Firm* — McDonald Hopkins LLC

(57) ABSTRACT

A filter device includes: a multilayer board including a first wiring layer where a first terminal and a second terminal are connected, a second wiring layer including a reference electrode, a third wiring layer between the first wiring layer and the second wiring layer, a first dielectric layer between the first wiring layer and the third wiring layer, and a second dielectric layer between the second wiring layer and the third wiring layer; a series passive element provided to a series wire; a parallel wire connecting the series wire and the reference electrode; a parallel passive element provided to the parallel wire; and an open stub provided to the third wiring layer. The parallel wire and the open stub include a first opposing portion and a second opposing portion, respectively, that are opposed to each other without a conductor interposed therebetween.

6 Claims, 16 Drawing Sheets

FILTER DEVICE

CROSS REFERENCE TO RELATED APPLICATION

This application claims priority from Japanese Patent Application No. 2022-176614 filed on Nov. 2, 2022. The content of this application is incorporated herein by reference in its entirety.

BACKGROUND ART

The present disclosure relates to filter devices.

A filter having a plurality of components implemented on a circuit substrate exists (for example, refer to Japanese Unexamined Patent Application Publication No. 2020-115616).

BRIEF SUMMARY

In the filter described in Japanese Unexamined Patent Application Publication No. 2020-115616, components each having an inductor, a resonant circuit, or an acoustic wave resonator on board are mounted on the upper surface of the circuit substrate. On the lower surface of the circuit substrate, terminals are provided. The terminals are electrically connected to the components through vias penetrating through the circuit substrate.

Meanwhile, when the components are arranged as being close to one another so as to reduce the size of the filter, signal power loss may increase or attenuation characteristics may be degraded due to electromagnetic coupling among the components.

The present disclosure provides a filter device capable of suppressing degradation in filter characteristics.

A filter device according to an aspect of the present disclosure includes a multilayer board, a series passive element, a parallel wire, a parallel passive element, and an open stub. The multilayer board includes: a first wiring layer where a series wire electrically connecting a first terminal and a second terminal together is provided; a second wiring layer including a reference electrode to which a reference potential is supplied; a third wiring layer positioned between the first wiring layer and the second wiring layer; a first dielectric layer positioned between the first wiring layer and the third wiring layer; and a second dielectric layer positioned between the second wiring layer and the third wiring layer. The series passive element is provided to the series wire. The parallel wire electrically connects the series wire and the reference electrode. The parallel passive element is provided to the parallel wire. The open stub is at least partially provided to the third wiring layer and has one end connected to the series wire and another end that is opened. The parallel wire and the open stub include a first opposing portion and a second opposing portion, respectively, that are opposed to each other without necessarily having a conductor interposed therebetween.

According to the present disclosure, a filter device capable of suppressing degradation in filter characteristics can be provided.

DETAILED DESCRIPTION

Figure 1:
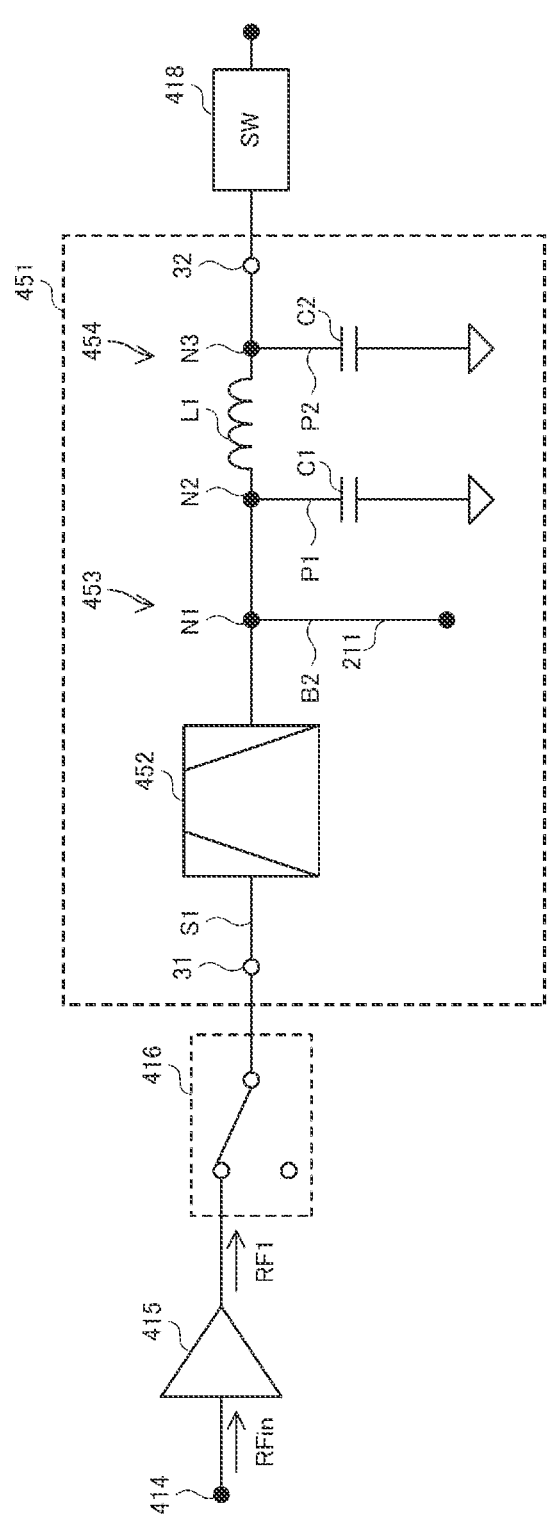
FIG. 1 is a circuit diagram of a frontend circuit including a filter circuit 451.

In the following, embodiments of the present disclosure are described in detail with reference to the drawings. Note that the same elements are provided with the same reference characters and redundant description is omitted as much as possible.

First Embodiment

A filter device 11 according to a first embodiment is described. FIG. 1 is a circuit diagram of a frontend circuit including a filter circuit 451.

As depicted in FIG. 1, a frontend circuit includes an amplifier 415, a switch 416, the filter circuit 451, and a single pole-double throw (SPDT) switch 418. The amplifier 415 amplifies a signal RFin having a radio frequency supplied from the preceding stage through an input terminal 414 and outputs a signal RF1 after amplification.

The filter circuit 451 includes a band pass filter 452, a stub circuit 453, and a low pass filter circuit 454.

An input terminal 31 (first terminal) in the filter circuit 451 is connected to an output terminal of the amplifier 415 through the switch 416. An output terminal 32 (second terminal) is connected to a subsequent stage (not depicted) through the SPDT switch 418.

A series wire S1 connects the input terminal 31 and the output terminal 32 together. On the series wire S1, the band pass filter 452, the stub circuit 453, and the low pass filter circuit 454 are provided in this sequence from the input terminal 31 toward the output terminal 32.

The stub circuit 453 includes an open stub 211. The open stub 211 has one end connected to the band pass filter 452 through a node N1 and another end that is opened.

The low pass filter circuit 454 is a n-type low pass filter, including an inductor L1 and capacitors C1 and C2. The inductor L1 has a first end connected to the node N1 through a node N2 and a second end connected to the output terminal 32 through a node N3.

A parallel wire P1 electrically connects the node N2 and the ground together. A parallel wire P2 electrically connects the node N3 and the ground together.

The capacitor C1 is provided to the parallel wire P1, and has a first end connected to the node N2 and a second end connected to the ground. The capacitor C2 is provided to the parallel wire P2, and has a first end connected to the node N3 and a second end connected to the ground.

Note that while the structure has been described in which the low pass filter circuit 454 is a n-type filter, the structure is not limited to this. The low pass filter circuit 454 may be a filter of another connection mode, such as an L-type or T-type.

Also, while the structure has been described in which the low pass filter circuit 454 is a low pass filter, the structure is not limited to this. For example, by replacing the inductor L1 by a capacitor and replacing each of the capacitors C1 and C2 by an inductor, the low pass filter circuit 454 can be a high pass filter. Furthermore, the low pass filter circuit 454 can be a band pass filter, band elimination filter, or the like.

Also, while the structure has been described in which the signal RF1 is supplied to the input terminal 31 in the filter circuit 451, the structure is not limited to this. The structure may be such that the signal RF1 is supplied to the output terminal 32.

In each drawing, an x axis, a y axis, and a z axis may be depicted. The x axis, the y axis, and the z axis form three-dimensional orthogonal coordinates in a right-handed system. In the following, an arrow direction of the x axis may be referred to as an x-axis+side and a direction opposite to the arrow direction may be referred to as an x-axis−side, and the same goes for the other axes. Note that the z-axis+side and the z-axis−side may be referred to as an "upper side" and a "lower side", respectively. Also, the z-axis direction may be referred to as a "laminating direction". Furthermore, planes orthogonal to the x axis, the y axis, and the z axis may be referred to as a yz plane, a zx plane, and an xy plane, respectively. Here, a direction of clockwise rotation when viewed from the upper side to the lower side is defined as a clockwise direction cw. Also, a direction of counterclockwise rotation when viewed from the upper side to the lower side is defined as a counterclockwise direction ccw.

Figure 2:
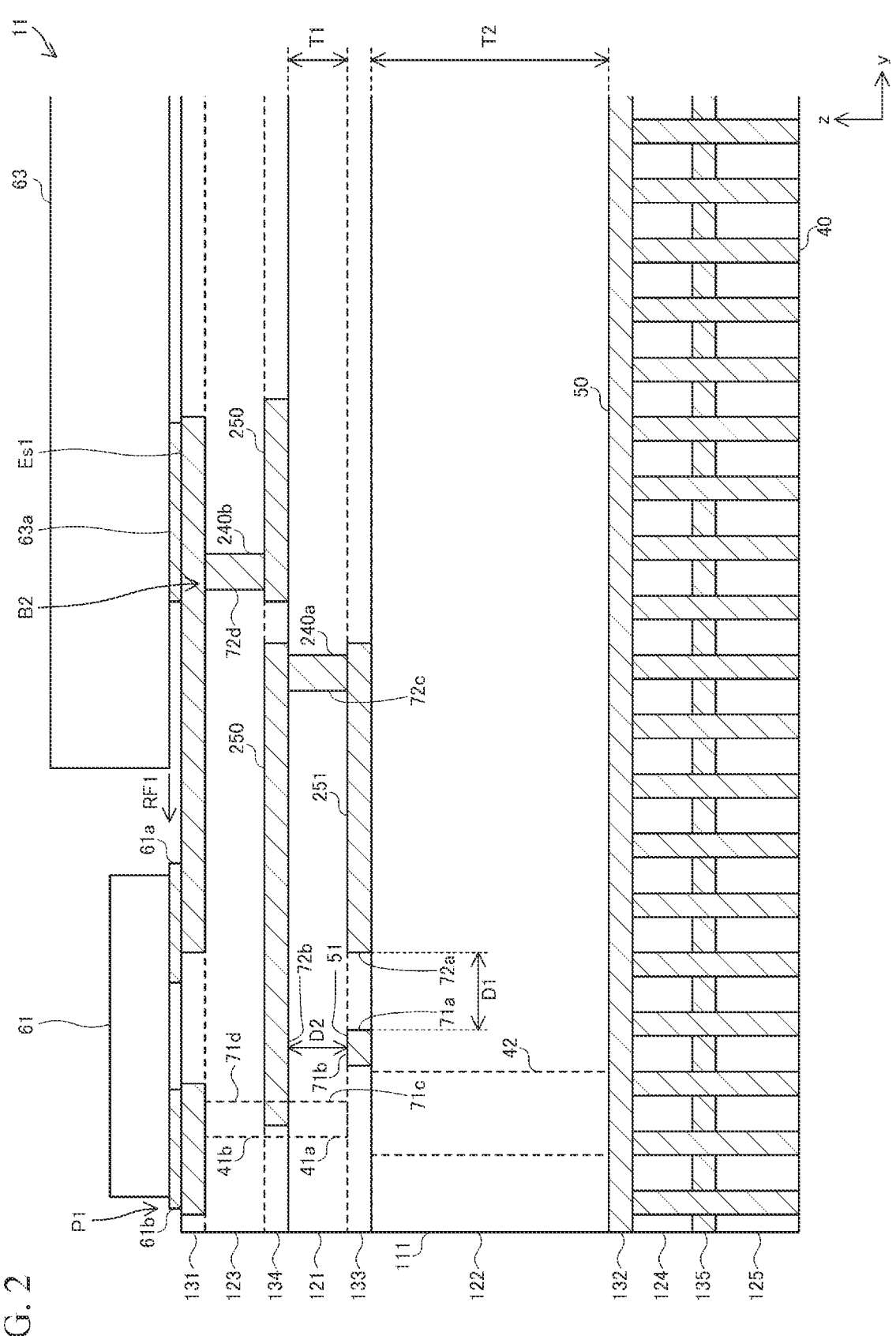
FIG. 2 is a view schematically depicting a section parallel to a yz plane of a filter device 11 where the filter circuit 451 is formed.
Figure 3:
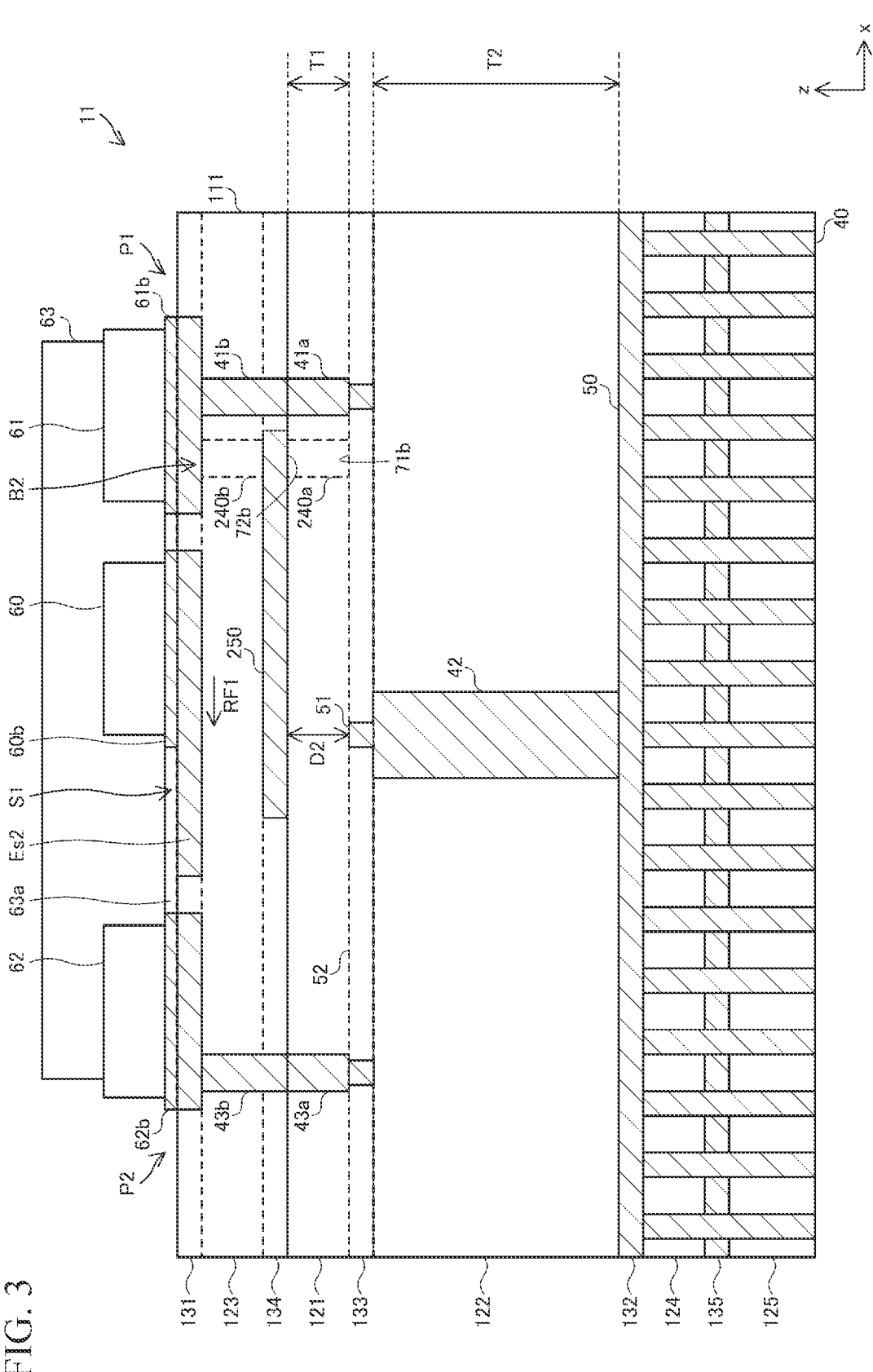
FIG. 3 is a view schematically depicting a section parallel to a zx plane of the filter device 11 where the filter circuit 451 is formed.
Figure 4:
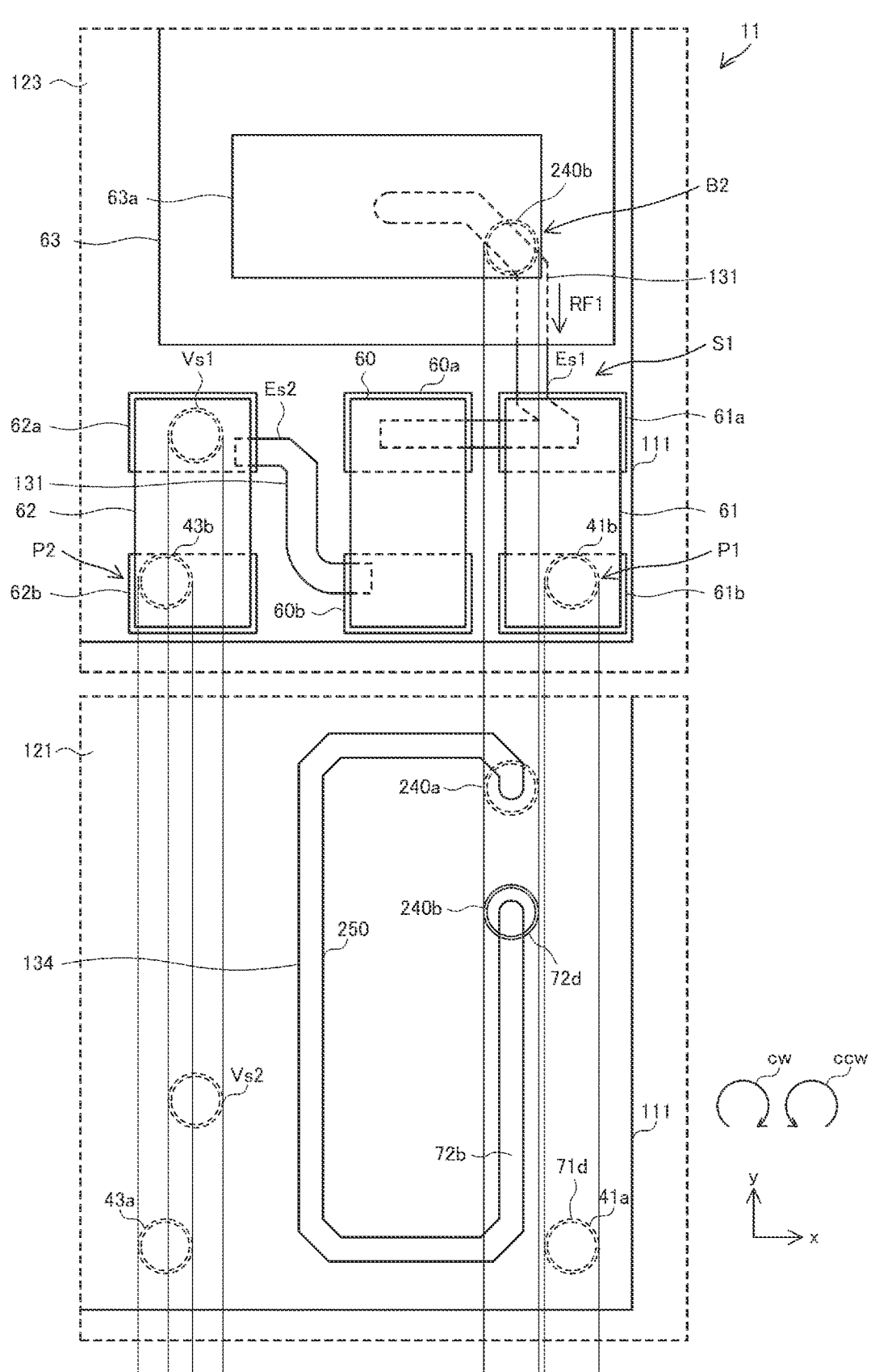
FIG. 4 is a view schematically depicting each section parallel to an xy plane of the filter device 11 where the filter circuit 451 is formed.
Figure 5:
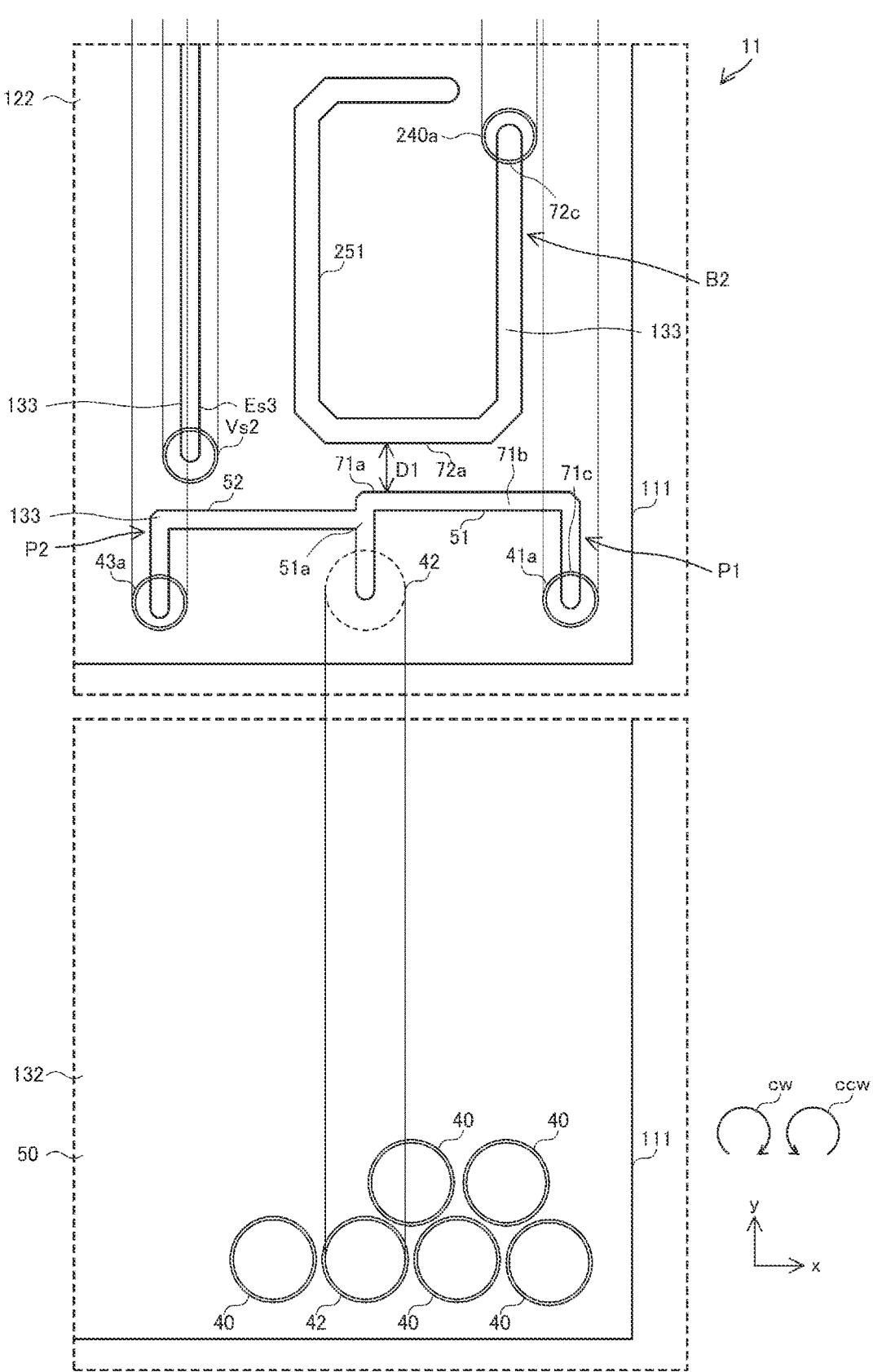
FIG. 5 is a view schematically depicting each section parallel to the xy plane of the filter device 11 where the filter circuit 451 is formed.

FIG. 2 is a view schematically depicting a section parallel to the yz plane of the filter device 11 where the filter circuit 451 is formed. FIG. 3 is a view schematically depicting a section parallel to the zx plane of the filter device 11 where the filter circuit 451 is formed. FIG. 4 and FIG. 5 are each view schematically depicting each section parallel to the xy plane of the filter device 11 where the filter circuit 451 is formed.

As depicted in FIG. 2 to FIG. 5, the filter device 11 includes series passive elements 60 and 63, parallel passive elements 61 and 62, a multilayer board 111, the series wire S1, parallel wires P1 and P2, and a branch wire B2.

The parallel wire P1 includes vias 41a (first via), 41b, and 42 and an electrode 51. The parallel wire P2 includes vias 43a and 43b and an electrode 52.

The branch wire B2 includes vias 240a (second via) and 240b and electrodes 250 and 251. In the present embodiment, each via is formed of a conductive material and has a columnar shape extending to a thickness direction. Note that the shape of each via may be any shape.

The multilayer board 111 includes dielectric layers 121 (first dielectric layer), 122 (second dielectric layer), 123 (third dielectric layer), 124, and 125 and wiring layers 131 (first wiring layer), 132 (second wiring layer), 133 (third wiring layer), 134 (fourth wiring layer), and 135.

The dielectric layers 123, 121, 122, 124, and 125 are provided in this sequence from the upper side toward the lower side. The dielectric layer 122 is, for example, a core layer. The dielectric layers 121, 123, 124, and 125 are each formed of, for example, prepreg.

The dielectric layers 121, 122, 123, 124, and 125 each has an upper surface substantially parallel to the xy plane (which may be hereinafter referred to as an upper surface) and a lower surface substantially parallel to the xy plane (which may be hereinafter referred to as a lower surface). The upper surface of the dielectric layer 122 is opposed to the lower surface of the dielectric layer 121 positioned on the upper side of the dielectric layer 122. The same goes for the other dielectric layers. Note that the upper surface and the lower surface may have asperities generated at the time of manufacture or a recess for providing a wiring layer.

The wiring layer 132 is provided between the dielectric layer 122 and the dielectric layer 124. The wiring layer 132 includes a reference electrode 50 to which a reference potential is supplied. The reference electrode 50 is, for example, an electrode formed over the entire region of the lower surface of the dielectric layer 122 and connected to the ground. Note that the reference electrode 50 is not necessarily required to be formed over the entire region of the lower surface of the dielectric layer 122 and is only required to be formed at least a partial region of the lower surface of the dielectric layer 122.

Between the dielectric layer 124 and the dielectric layer 125, for example, the wiring layer 135 is provided. The dielectric layers 124 and 125 are provided with a plurality of vias 40 penetrating through the dielectric layers 124 and 125. Upper end portions of the vias 40 are electrically connected to the reference electrode 50.

Between the dielectric layer 121 and the dielectric layer 123, the wiring layer 134 is provided. The wiring layer 131 is provided on the upper surface of the dielectric layer 123. Note that the wiring layers 133 and 134 are only required to be provided between the wiring layer 131 and the wiring layer 132. In other words, the wiring layer 133 may be provided at a position relatively close to the wiring layer 131 (between the dielectric layer 121 and the dielectric layer 123) and the wiring layer 134 may be provided relatively close to the wiring layer 132 (between the dielectric layer 121 and the dielectric layer 122).

The dielectric layer 122 has a thickness T2 different from a thickness T1 of the dielectric layer 121. The "thickness" herein is a size of the dielectric layer in a direction in which the dielectric layers 121 to 125 are laminated in the multilayer board 111 (laminating direction), that is, a distance between the upper surface and the lower surface of the dielectric layer. In the present embodiment, the thickness T1 is smaller than the thickness T2. Note that the thickness T1 may be larger than the thickness T2. The thickness of the dielectric layer 123 is, for example, substantially equal to the thickness of the dielectric layer 121.

The series passive elements 60 and 63 and the parallel passive elements 61 and 62 are provided on the upper surface of the wiring layer 131.

In the following, the layout of the respective passive elements, the respective vias, and the respective electrodes is described with reference to FIG. 2 to FIG. 5. FIG. 4 depicts a view of the dielectric layer 123, the wiring layer 131, and the respective passive elements viewed from above and a view of the dielectric layer 121 and the wiring layer 134 viewed from above. FIG. 5 depicts a view of the dielectric layer 122 and the wiring layer 133 viewed from above and a view of the wiring layer 132 viewed from above.

In the present embodiment, when the upper surface of the dielectric layer 123 is viewed in plan view along a laminating direction, the filter device 11 is provided at a corner on the x-axis+side and the y-axis−side of the multilayer board 111. The series passive elements 60 and 63 are surface mount devices (SMDs) functioning as the inductor L1 and the band pass filter 452, respectively. The parallel passive elements 61 and 62 are SMDs functioning as the capacitors C1 and C2, respectively.

The parallel passive element 61, the series passive element 60, and the parallel passive element 62 are provided in this sequence from the x-axis+side toward the x-axis−side. The series passive element 63 is provided on the y-axis+side of the series passive element 60 and the parallel passive elements 61 and 62.

With reference mainly to FIG. 4 and FIG. 5, the series wire S1 includes, for example, electrodes Es1, Es2, and Es3 and vias Vs1 and Vs2. The electrode Es1 and the electrode Es2 are formed of the wiring layer 131 subjected to patterning. The electrode Es3 is formed by the wiring layer 133 subjected to patterning. The vias Vs1 and Vs2 penetrate through the dielectric layers 123 and 121, respectively, substantially in parallel to the z axis.

The series passive element 63 has a first end (not depicted) connected to the input terminal 31 (not depicted) and a second end connected to the electrode Es1 through a pad 63a.

The parallel passive element 61 electrically connects the series wire S1 and the via 41b together. More specifically, the parallel passive element 61 has a first end connected to the electrode Es1 through a pad 61a and a second end connected to an upper end portion of the via 41b through a pad 61b.

The series passive element 60 electrically connects the electrode Es1 and the electrode Es2 together. More specifically, the series passive element 60 has a first end connected to the electrode Es1 through a pad 60a and a second end connected to the electrode Es2 through a pad 60b.

The parallel passive element 62 electrically connects the series wire S1 and the via 43b together. More specifically, the parallel passive element 62 has a first end connected to the electrode Es2 through a pad 62a and a second end connected to an upper end portion of the via 43b through a pad 62b.

An upper end portion of the via Vs1 is connected to the pad 62a. An upper end portion of the via Vs2 is connected to a lower end portion of the via Vs1. The electrode Es3 has a first end connected to a lower end portion of the via Vs2 and a second end connected to the output terminal 32 (not depicted).

With reference mainly to FIG. 3 to FIG. 5, the vias 41b and 43b penetrate through the dielectric layer 123 substantially in parallel with the z axis. When the upper surface of the dielectric layer 123 is viewed in plan view along the laminating direction, the vias 41b and 43b overlap the parallel passive elements 61 and 62, respectively. The diameter of the via 41b is, for example, substantially equal to the diameter of the via 43b.

The vias 41a and 43a penetrate through the dielectric layer 121 substantially in parallel with the z axis. In the present embodiment, the vias 41a and 43a have diameters substantially equal to the diameter of the via 41b and the diameter of the via 43b, respectively. When the upper surface of the dielectric layer 121 is viewed in plan view along the laminating direction, the vias 41a and 43a substantially overlap the vias 41b and 43b, respectively. An upper end portion of the via 41a and an upper end portion of the via 43a are connected to a lower end portion of the via 41b and a lower end portion of the via 43b, respectively.

The wiring layer 133 includes the electrode 51 (first electrode) and the electrodes 52 (first electrode) and 251. The electrodes 51, 52, and 251 are formed of the wiring layer 133 subjected to patterning.

The electrode 51 is extended from the via 41a and electrically connects the via 41a and the via 42 together. The electrode 52 is extended from the via 43a and electrically connects the via 43a and the via 42 together. Note herein that "extended" indicates "extended so as to have a predetermined length".

The electrodes 51 and 52 are each wound on a plane where the wiring layer 133 extends. Also, the orientation in which the electrode 51 is wound and the orientation in which the electrode 52 is wound are opposite. More specifically, the electrode 51 has a first end connected to a lower end portion of the via 41a and a second end positioned between a lower end portion of the via 41a and a lower end portion of the via 43a. The electrode 51 is wound from the first end to the second end to the counterclockwise direction ccw on the xy plane with a turn more than or equal to ¼ and less than ¾.

The electrode 52 has a first end connected to the lower end portion of the via 43a and a second end positioned at the same position as the position of the second end of the electrode 51. The electrode 52 is wound from the first end to the second end to the clockwise direction cw on the xy plane with a turn more than or equal to ¼ and less than ¾. Note that a portion between a connecting portion 51a between the electrodes 51 and 52 and the second end of the electrode 51 is shared by the electrodes 51 and 52.

The via 42 penetrates through the dielectric layer 122 substantially in parallel with the z axis and has a cross-sectional area different from the cross-sectional area of the vias 41a and 43a. Also, the via 42 electrically connects the electrodes 51 and 52 and the reference electrode 50 together. The "cross-sectional area" herein refers to an area when the via is viewed in cross-section in a direction orthogonal to the laminating direction of the dielectric layers 121 to 125, and the diameter of the via is a specific example of this.

Note that when the diameter of a via penetrating through a dielectric layer is changed in that dielectric layer due to variations in manufacture or the like, the cross-sectional area of a location with the thickest diameter of that via may be taken as the cross-sectional area of that via. Also, the shape of the cross section of the via is not limited to a circle, and may be a polygon such as a triangle or quadrangle. In this case, when the cross-sectional area of the via is changed in the dielectric layer, the largest cross-sectional area of the via may be taken as the cross-sectional area of that via.

More specifically, the via 42 has a diameter larger than the diameter of the via 41*a* and larger than the diameter of the via 43*a*. When the upper surface of the dielectric layer 122 is viewed in plan view along the laminating direction, the via 42 is positioned between the via 41*a* and the via 43*a* and does not overlap any of the vias 41*a* and 43*a*. An upper end portion of the via 42 is connected to the second end of the electrode 51 and the second end of the electrode 52. A lower end portion of the via 42 is connected to the reference electrode 50.

The branch wire B2 functions as the open stub 211. The wiring layer 134 includes the electrode 250 included in the branch wire B2. The electrode 250 is formed by the wiring layer 134 subjected to patterning.

The via 240*b* penetrates through the dielectric layer 123 substantially parallel with the z axis. The via 240*a* penetrates through the dielectric layer 121 substantially parallel with the z axis. When the upper surface of the dielectric layer 123 is viewed in plan view along the laminating direction, the via 240*b* overlaps the series passive element 63. The via 240*a* is positioned on the y-axis+side of the via 240*b*. The diameter of the via 240*a* is substantially equal to the diameter of the via 240*b*, for example.

An upper end portion of the via 240*b* is connected to the electrode Es1. The electrode 250 is an electrode extending from a first end connected to a lower end portion of the via 240*b* to a second end in the sequence of the y-axis−side, the x-axis−side, the y-axis+side, the x-axis+side, and the y-axis−side, the electrode having a rectangular shape with a cutout.

An upper end portion of the via 240*a* is connected to the second end of the electrode 250. The electrode 251 is an electrode extending from a first end connected to the lower end portion of the via 240*a* to another end in the sequence of the y-axis−side, the x-axis−side, the y-axis+side, and the x-axis+side, the electrode having a rectangular shape with a cutout.

A second end of the electrode 251 is opened. The electrode 251 is opposed to the reference electrode 50 without necessarily having a conductor interposed therebetween. When the multilayer board 111 is viewed in plan view along the laminating direction, the reference electrode 50 and the electrode 251 overlap each other.

Figure 6:
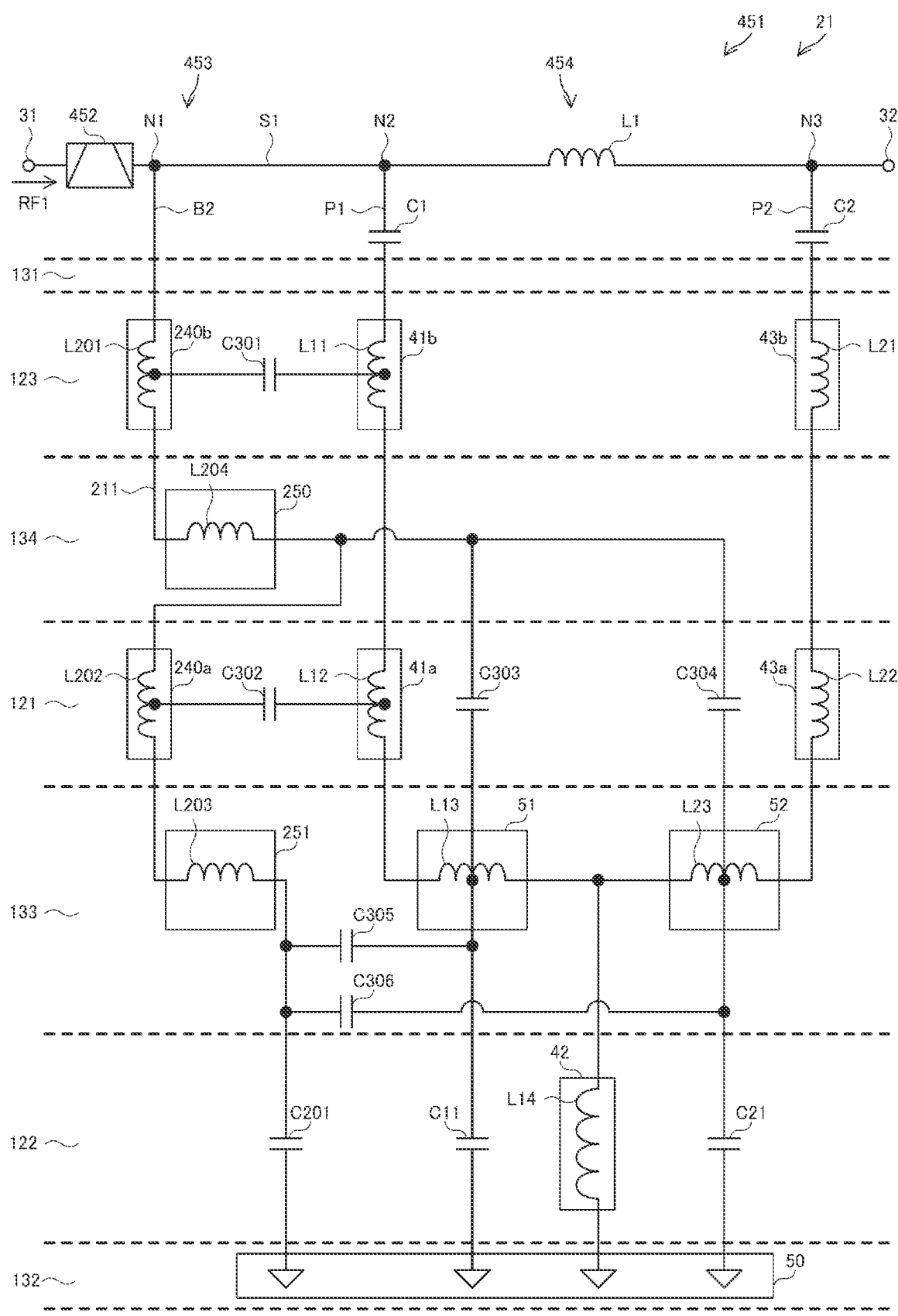
FIG. 6 is a circuit diagram of an equivalent circuit 21 of the filter device 11.

FIG. 6 is a circuit diagram of an equivalent circuit 21 of the filter device 11. As depicted in FIG. 6, the vias and the electrodes each function also as an inductor. Also, the electrodes each function also as a capacitor. Also, the branch wire B2 and the parallel wire P1 function also as capacitors.

More specifically, the vias 41*b*, 41*a*, and 42 included in the parallel wire P1 function as inductors L11, L12, and L14, respectively. The vias 43*b* and 43*a* included in the parallel wire P2 function as inductors L21 and L22, respectively. The vias 240*b* and 240*a* included in the branch wire B2 function as inductors L201 and L202, respectively.

The inductances of the vias 41*b*, 41*a*, 42, 43*b*, 43*a*, 240*b*, and 240*a* each has a value in accordance with the shape of that via. Specifically, as the diameter of the via is larger, the inductance of the via is smaller. Also, as the length of the via, that is, the thickness of the dielectric layer provided with that via, is larger, the inductance of the via is larger.

Therefore, by adjusting the diameter of the via and the thickness of the dielectric layer provided with that via, the inductance of that via can be adjusted.

Also, the electrode 51 included in the parallel wire P1 functions as an inductor L13, and forms a capacitor C11 with the reference electrode 50. Similarly, the electrode 52 included in the parallel wire P2 functions as an inductor L23, and forms a capacitor C21 with the reference electrode 50. Similarly, the electrode 251 included in the branch wire B2 functions as an inductor L203, and forms a capacitor C201 (second capacitor) with the reference electrode 50. The electrode 250 functions as an inductor L204.

The inductance of each of the electrodes 51, 52, 250, and 251 has a value in accordance with the number of windings, width, length, and so forth of that electrode. Also, the capacitance of the capacitor formed between the electrode 51, 52, or 251 and the reference electrode 50 has a value in accordance with the distance between that electrode and the reference electrode 50, the area of that electrode, and so forth.

Therefore, by adjusting the shape and arrangement of the electrode 51, the inductance of the electrode 51 can be adjusted, and also the capacitance of the capacitor C11 formed between the electrode 51 and the reference electrode 50 can be adjusted. The same goes for the electrodes 52 and 251.

As depicted in FIG. 2 to FIG. 6, the parallel wire P1 and the branch wire B2 include first opposing portions and second opposing portions, respectively, that are opposed to each other without necessarily having a conductor interposed therebetween. Specifically, the parallel wire P1 includes first opposing portions 71*a* (third portion), 71*b* (first portion), 71*c*, and 71*d*. The branch wire B2 includes second opposing portions 72*a* (fourth portion), 72*b* (second portion), 72*c*, and 72*d*.

The first opposing portion 71*a* and the second opposing portion 72*a* are examples of a "first opposing portion" and a "second opposing portion", respectively. The first opposing portion 71*b* and the second opposing portion 72*b* are examples of a "first opposing portion" and a "second opposing portion", respectively. The first opposing portion 71*c* and the second opposing portion 72*c* are examples of a "first opposing portion" and a "second opposing portion", respectively. The first opposing portion 71*d* and the second opposing portion 72*d* are examples of a "first opposing portion" and a "second opposing portion", respectively.

The first opposing portion 71*a* is at least part of the electrodes 51 and 52 and, specifically, a surface of the electrodes 51 and 52 on the y-axis+side.

The second opposing portion 72*a* is at least part of the electrode 251 and, specifically, a surface of the electrode 251 on the y-axis−side.

The first opposing portion 71*a* is opposed to the second opposing portion 72*a* without necessarily having a conductor interposed therebetween. The first opposing portion 71*a* and the second opposing portion 72*a* form capacitors C305 (first capacitor) and C306 (first capacitor). In the following, the capacitors C305 and C306 may be referred to as intralayer capacitors C305 and C306, respectively.

More specifically, the first opposing portion 71*a* and the second opposing portion 72*a* are opposed to each other in the same wiring layer 133. The first opposing portion 71*a* in the electrode 51 and the second opposing portion 72*a* in the electrode 251 form the intralayer capacitor C305. The first opposing portion 71*a* in the electrode 52 and the second opposing portion 72*a* in the electrode 251 form the intralayer capacitor C306.

The first opposing portion 71*b* is at least another part of the electrodes 51 and 52 and, specifically, a surface of the electrodes 51 and 52 on the z-axis+side.

The second opposing portion 72b is at least part of the electrode 250 and, specifically, a surface of the electrode 250 on the z-axis−side.

The first opposing portion 71b is opposed to the second opposing portion 72b without necessarily having a conductor interposed therebetween. When the multilayer board 111 is viewed in plan view along the laminating direction, there is a portion where the first opposing portion 71b and the second opposing portion 72b overlap each other.

The first opposing portion 71b and the second opposing portion 72b form capacitors C303 (first capacitor) and C304 (first capacitor). In the following, the capacitors C303 and C304 may be referred to as interlayer capacitors C303 and C304, respectively.

More specifically, the first opposing portion 71b and the second opposing portion 72b are opposed to each other as having the dielectric layer 121 interposed between the wiring layers 133 and 134. The first opposing portion 71b in the electrode 51 and the second opposing portion 72b in the electrode 250 form the interlayer capacitor C303. The first opposing portion 71b in the electrode 52 and the second opposing portion 72b in the electrode 250 form the interlayer capacitor C304.

The capacitance of the capacitor formed between the first opposing portion 71b and the second opposing portion 72b and the capacitance of the capacitor between the first opposing portion 71a and the second opposing portion 72a are equal. Specifically, the combined capacitance of the interlayer capacitors C303 and C304 and the combined capacitance of the intralayer capacitors C305 and C306 are equal. Note that "equal" herein is assumed to also include a case in which their capacitance values are equivalent as including variations in manufacture (for example, one capacitance value falls within a value larger than or equal to 95% and smaller than or equal to 105% of the other capacitance value).

The combined capacitance of the interlayer capacitors C303 and C304 can be adjusted by changing a distance D2 between the electrode 250 and the electrodes 51 and 52, that is, the thickness T1. Also, it can be adjusted by changing an area of a portion where the electrode 250 and the electrodes 51 and 52 overlap each other when the multilayer board 111 is viewed in plan view along the laminating direction. That area can be changed by, for example, changing the electrode width of the electrode 250, 51, or 52.

The combined capacitance of the intralayer capacitors C305 and C306 can be adjusted by changing a distance D1 between the electrode 251 and the electrodes 51 and 52. Also, it can be adjusted by changing an area of a portion where the electrode 251 and the electrodes 51 and 52 overlap each other when the multilayer board 111 is viewed in plan view along the y-axis direction. That area can be changed by, for example, changing the electrode thickness of the electrode 251, 51, or 52. Also, that area can be changed by, for example, changing the length of a section where the electrode 251 and the electrodes 51 and 52 run in parallel as being close to each other.

Note that the combined capacitance of the interlayer capacitors C303 and C304 and the combined capacitance of the intralayer capacitors C305 and C306 may be different from each other. Note that "different" herein is assumed not to include a case in which their capacitance values are equivalent as including variations in manufacture (for example, one capacitance value falls within a value larger than or equal to 95% and smaller than or equal to 105% of the other capacitance value).

The first opposing portion 71c is at least part of the via 41a and, specifically, a surface of the via 41a on the y-axis+side.

The second opposing portion 72c is at least part of the via 240a and, specifically, a surface of the via 240a on the y-axis−side.

The first opposing portion 71c is opposed to the second opposing portion 72c without necessarily having a conductor interposed therebetween. The first opposing portion 71c and the second opposing portion 72c form a capacitor C302 (first capacitor). In the following, the capacitor C302 may be referred to as an intralayer capacitor C302.

More specifically, the first opposing portion 71c and the second opposing portion 72c are opposed to each other in the same dielectric layer 121. The capacitance of the intralayer capacitor C302 can be adjusted by changing a distance between the via 240a and the via 41a and the thickness of the via 240a or the thickness of the via 41a.

The first opposing portion 71d is at least part of the via 41b and, specifically, a surface of the via 41b on the y-axis+side.

The second opposing portion 72d is at least part of the via 240b and, specifically, a surface of the via 240b on the y-axis−side.

The first opposing portion 71d is opposed to the second opposing portion 72d without necessarily having a conductor interposed therebetween. The first opposing portion 71d and the second opposing portion 72d form a capacitor C301 (first capacitor). In the following, the capacitor C301 may be referred to as an intralayer capacitor C301.

More specifically, the first opposing portion 71d and the second opposing portion 72d are opposed to each other in the same dielectric layer 123. The capacitance of the intralayer capacitor C301 can be adjusted by changing a distance between the via 240b and the via 41b and the thickness of the via 240b or the thickness of the via 41b.

Figure 7:
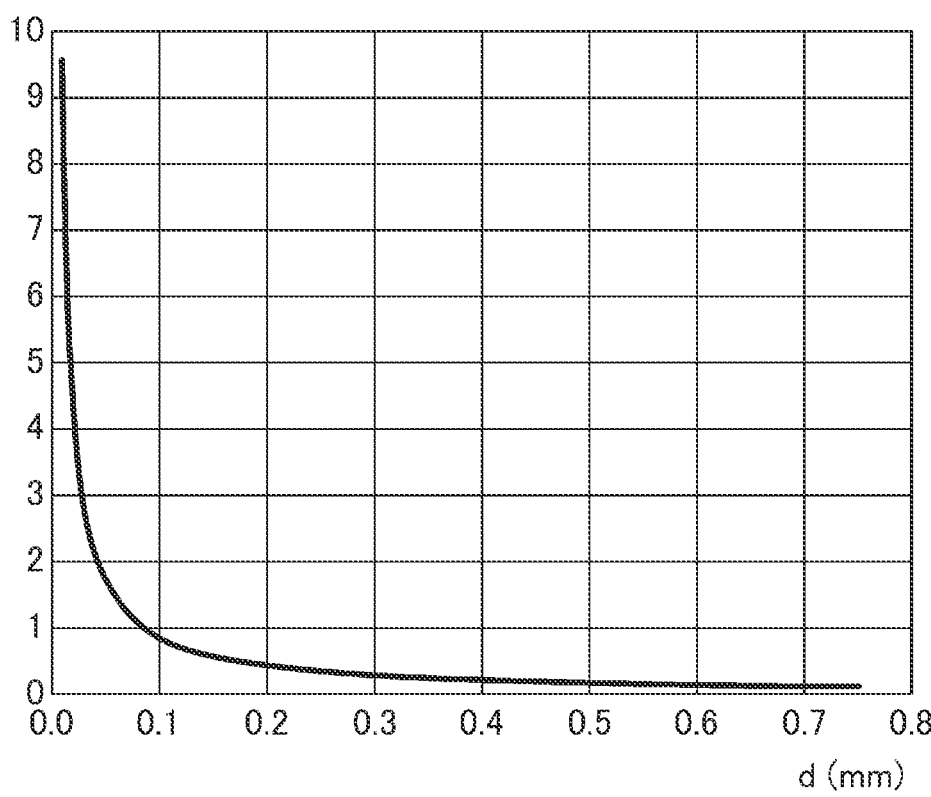
FIG. 7 is a drawing depicting one example of changes in electrostatic capacity with respect to a distance d between electrodes.

FIG. 7 is a drawing depicting one example of changes in electrostatic capacity with respect to a distance d between electrodes. Note that the horizontal axis represents a distance d between electrodes in units of "mm" and the vertical axis represents electrostatic capacity in units of "pF".

In FIG. 7, changes in electrostatic capacity with respect to the distance d between electrodes are depicted when the surface area of the electrodes and the relative permittivity of a dielectric provided between the electrodes are 0.02 square millimeters and 4.3, respectively, in a parallel plate capacitor. In FIG. 7, it is indicated that an electrostatic capacity of approximately 0.1 pF is obtained at least even if the distance d between electrodes is far to be close to 0.7 millimeters. Also, it has been found that this electrostatic capacity of approximately 0.1 pF is obtained as unchanged even if the distance d is far to be close to approximately 1 millimeter.

As described above, in consideration of electrostatic capacity useful for filter pole generation, the distance between the first opposing portion and the second opposing portion is preferably smaller than or equal to 1 millimeter. Also, when the distance between the first opposing portion and the second opposing portion is set smaller than or equal to 0.7 millimeters, suitable electrostatic capacity can be more reliably obtained.

Figure 8:
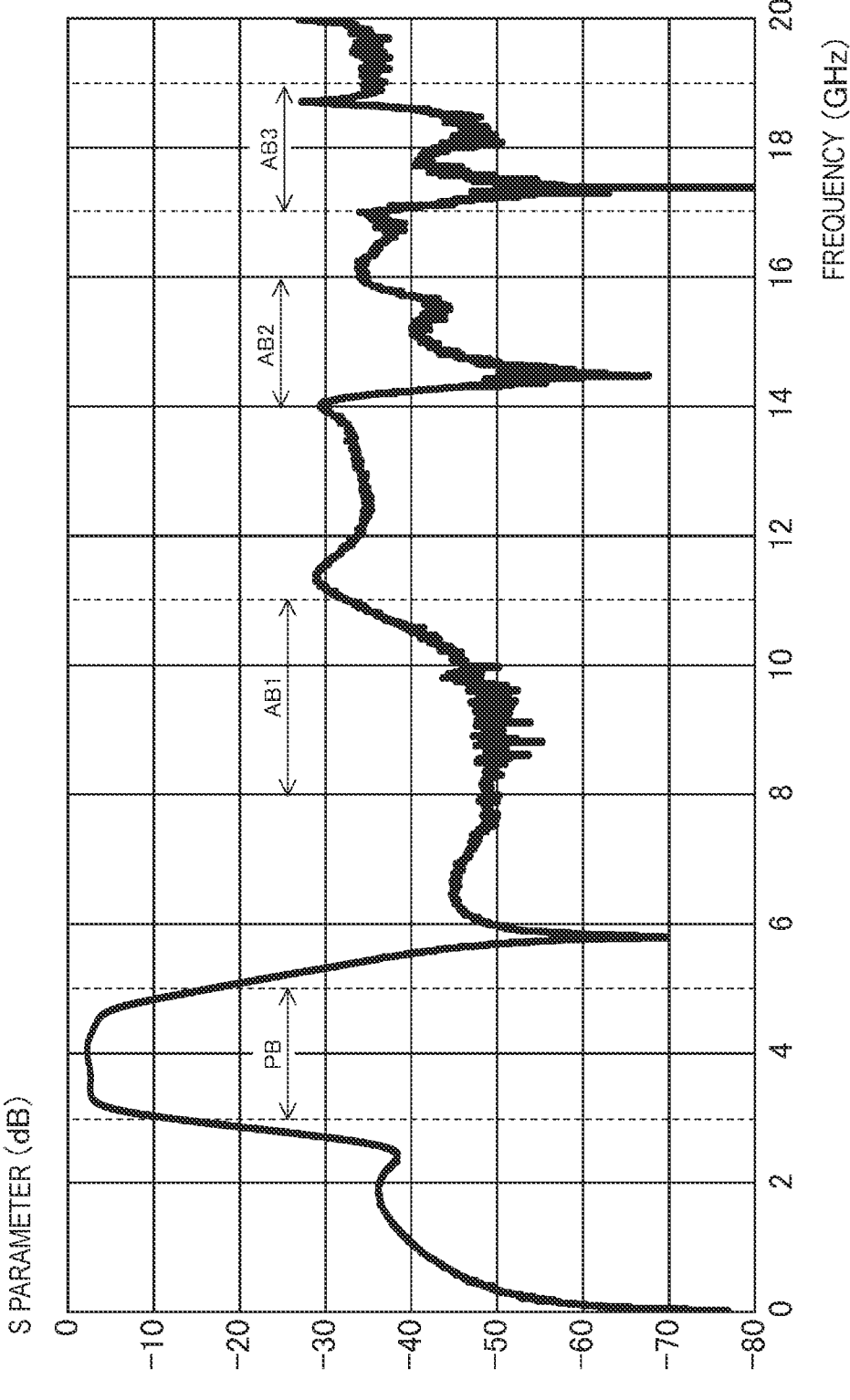
FIG. 8 is a drawing depicting one example of attenuation characteristics of the filter device 11.

FIG. 8 is a drawing depicting one example of attenuation characteristics of the filter device 11. Note that the horizontal axis represents frequency in units of "GHz" and the vertical axis represents an S parameter in units of "dB".

As depicted in FIG. 8, by the band pass filter 452, a pass band PB letting the signal RF1 of approximately 3 GHz to 5 GHz pass is generated. While noise in a frequency band higher than or equal to 5 GHz cannot be sufficiently attenuated only by the band pass filter 452, that noise can be attenuated by the low pass filter circuit 454.

By the stub circuit 453, an attenuation band AB1 of approximately 8 GHz to 9 GHz is generated. With this, for example, a harmonic wave of the signal RF1 can be attenuated.

Furthermore, by resonant circuits including the capacitors C301 to C306, the inductors L201 to L204, and so forth, a pole of an attenuation band AB2 of approximately 14 GHz to 16 GHz and a pole of an attenuation band AB3 of approximately 17 GHz to 19 GHz are generated.

With this, for example, the harmonic wave can be attenuated without necessarily additionally providing a reactance element such as an inductor and a capacitor. Therefore, it is possible to suppress degradation in filter characteristics as decreasing the size of the filter device 11.

Second Embodiment

A filter device 12 according to a second embodiment is described. In the second embodiment onward, description of matters in common with the first embodiment are omitted, and only different points are described. In particular, similar operations and effects by similar structures are not mentioned for each embodiment.

Figure 9:
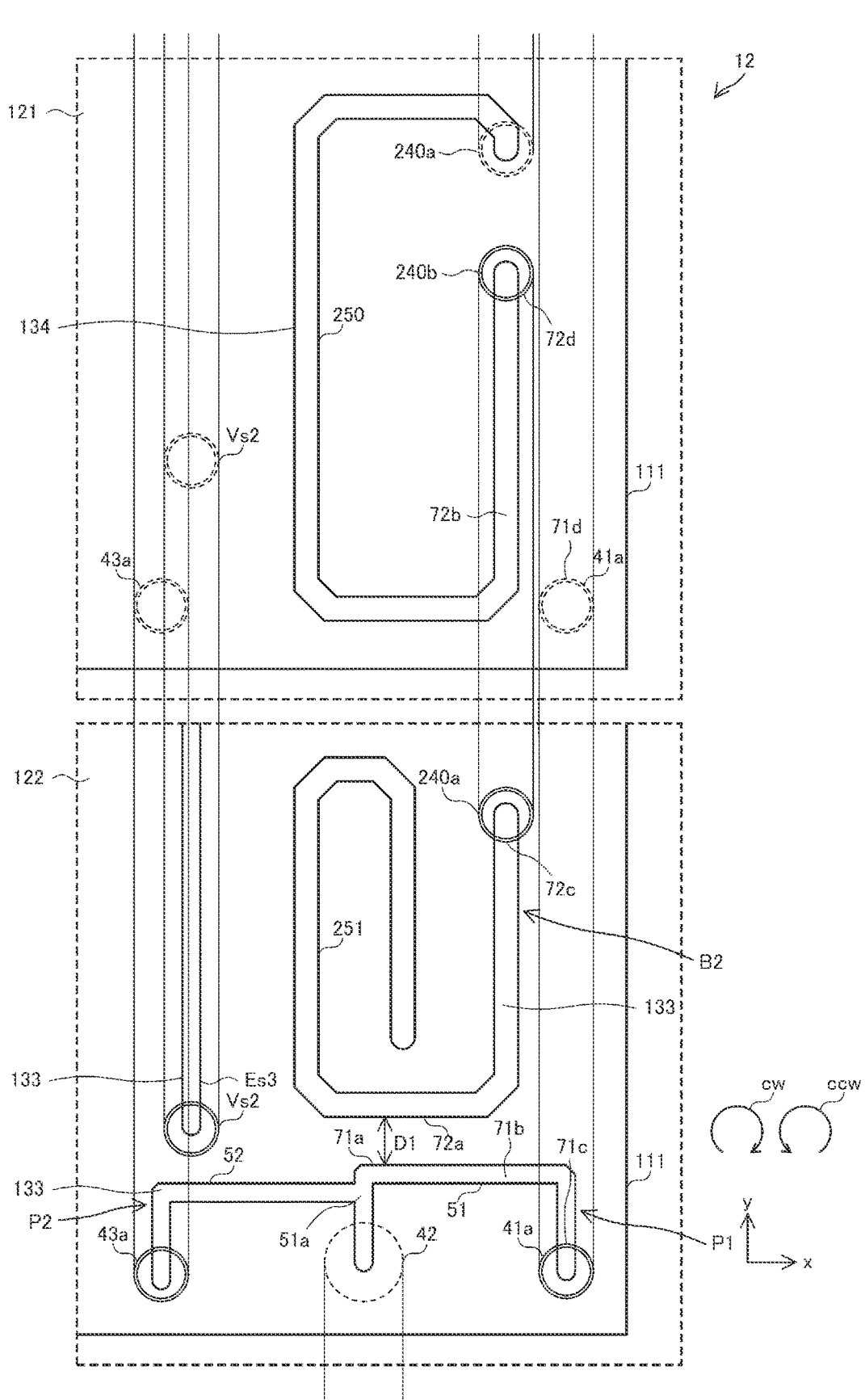
FIG. 9 is a view schematically depicting each section parallel to an xy plane of a filter device 12 where the filter circuit 451 is formed.

FIG. 9 is a view schematically depicting each section parallel to the xy plane of the filter device 12 where the filter circuit 451 is formed. FIG. 9 depicts a view of the dielectric layer 121 and the wiring layer 134 when viewed from above and a view of the dielectric layer 122 and the wiring layer 133 when viewed from above.

As depicted in FIG. 9, the filter device 12 according to the second embodiment is different from the filter device 11 according to the first embodiment in that the electrode 251 formed on the wiring layer 133 has one turn or more.

Specifically, the electrode 251 is an electrode wound from a first end connected to the lower end portion of the via 240a to the second end in the sequence of the y-axis−side, the x-axis−side, the y-axis+side, the x-axis+side, and the y-axis−side with a one and half turns.

With this, the length of the electrode 251 can be increased, while an increase in the area exclusively occupied by the electrode 251 is suppressed.

Third Embodiment

Figure 10:
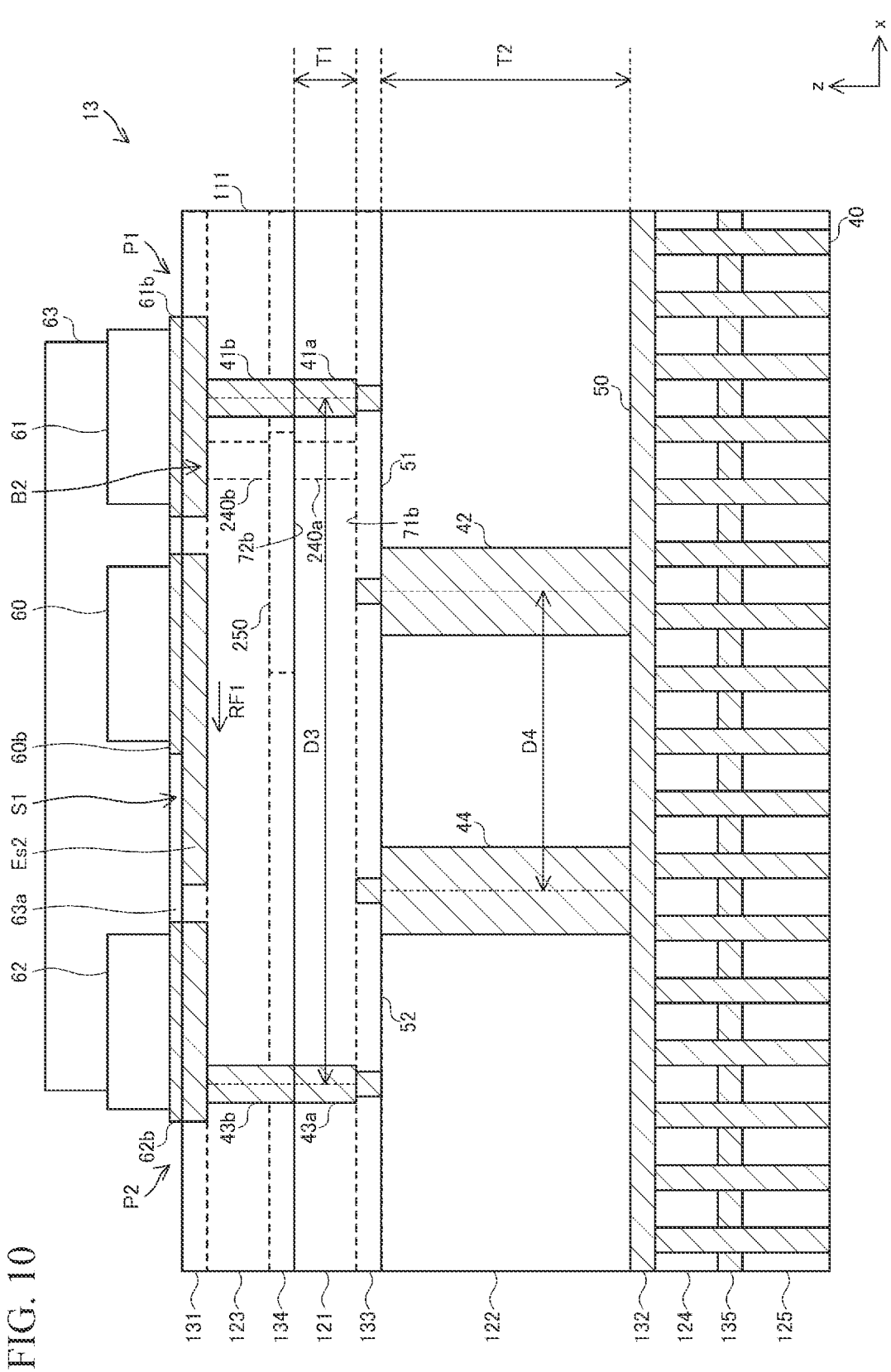
FIG. 10 is a view schematically depicting a section parallel to a zx plane of a filter device 13 where the filter circuit 451 is formed.
Figure 11:
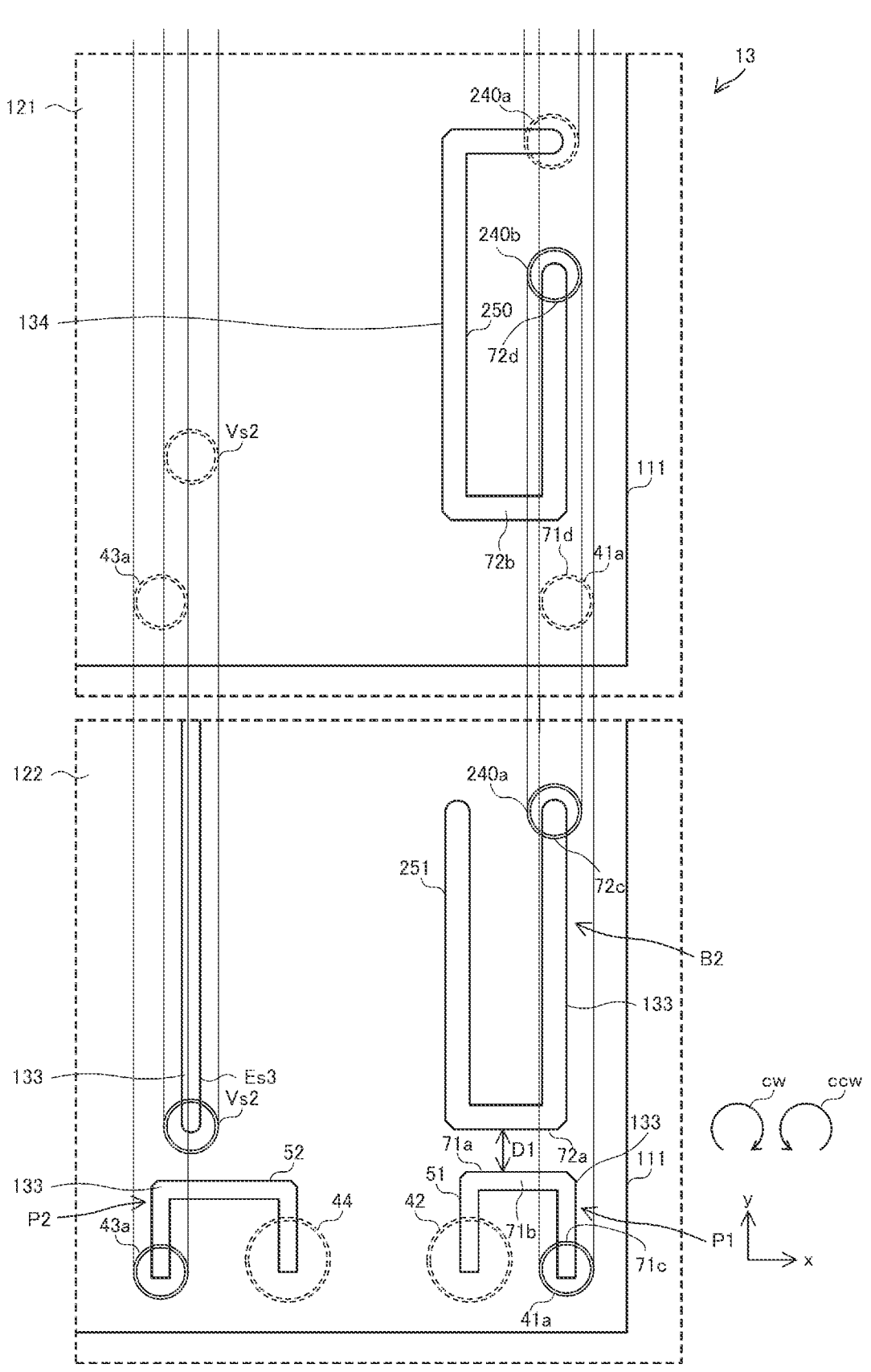
FIG. 11 is a view schematically depicting each section parallel to an xy plane of the filter device 13 where the filter circuit 451 is formed.

A filter device 13 according to a third embodiment is described. FIG. 10 is a view schematically depicting a section parallel to the zx plane of the filter device 13 where the filter circuit 451 is formed. FIG. 11 is a view schematically depicting each section parallel to the xy plane of the filter device 13 where the filter circuit 451 is formed. Note that the way of viewing FIG. 11 is similar to that of FIG. 9.

As depicted in FIG. 10 and FIG. 11, the filter device 13 according to the third embodiment is different from the filter device 11 according to the first embodiment in that the respective parallel wires P1 and P2 are completely independently connected to the ground.

The filter device 13 further includes a via 44, compared with the filter device 11 depicted in FIG. 3.

In the present embodiment, the parallel wire P1 includes the vias 41b, 41a, and 42 and the electrode 51. The parallel wire P2 includes the vias 43b, 43a, and 44 and the electrode 52.

The electrode 51 in the wiring layer 132 is extended from the via 41a and electrically connects the via 41a and the via

42 together. The electrode 52 is extended from the via 43a and electrically connects the via 43a and the via 44 together.

More specifically, the electrode 51 has a first end connected to the lower end portion of the via 41a and a second end positioned on the x-axis−side of that first end. The electrode 51 is wound from the first end to the second end to the counterclockwise direction ccw on the xy plane with a turn more than or equal to ¼ and less than ¾.

The electrode 52 has a first end connected to the lower end portion of the via 43a and a second end positioned on the x-axis+side of that first end. The electrode 52 is wound from the first end to the second end to the clockwise direction cw on the xy plane with a turn more than or equal to ¼ and less than ¾.

The via 42 penetrates through the dielectric layer 122 substantially in parallel with the z axis and electrically connects the electrode 51 and the reference electrode 50 together. More specifically, the via 42 has a diameter larger than the diameter of the via 41a. When the upper surface of the dielectric layer 122 is viewed in plan view along the laminating direction, the via 42 is positioned on the x-axis−side of the via 41a and does not overlap the via 41a. The upper end portion and the lower end portion of the via 42 are connected to the second end of the electrode 51 and the reference electrode 50, respectively.

The via 44 penetrates through the dielectric layer 122 substantially in parallel with the z axis and electrically connects the electrode 52 and the reference electrode 50 together. More specifically, the via 44 has a diameter larger than the diameter of the via 43a, for example, a diameter substantially equal to the diameter of the via 42. When the upper surface of the dielectric layer 122 is viewed in plan view along the laminating direction, the via 44 is positioned on the x-axis+side of the via 43a and does not overlap the via 43a. The upper end portion and the lower end portion of the via 44 are connected to the second end of the electrode 52 and the reference electrode 50, respectively.

A distance D4 between the via 42 and the via 44 is shorter than a distance D3 between the via 41a and the via 43a. More specifically, the distance D4 is, for example, the length of the shortest straight line connecting the center axis of the via 42 and the center axis of the via 44. The distance D3 is, for example, the length of the shortest straight line connecting the center axis of the via 41a and the center axis of the via 43a.

According to this, compared with the distance between vias relatively close to the series passive element 60 and the parallel passive elements 61 and 62, the distance between vias relatively far away from the series passive element 60 and the parallel passive elements 61 and 62 is small. Thus, when the filter device 13 is viewed in plan view along the laminating direction, it is possible to easily form the vias 42 and 44 inside a region provided with the series passive element 60 and the parallel passive elements 61 and 62. Therefore, since the space of the multilayer board 111 occupied by the vias 41a and 43a can be minimized, a decrease in size of the filter device 13 can be easily achieved. Note that the distance D4 may be larger than the distance D3.

Figure 12:
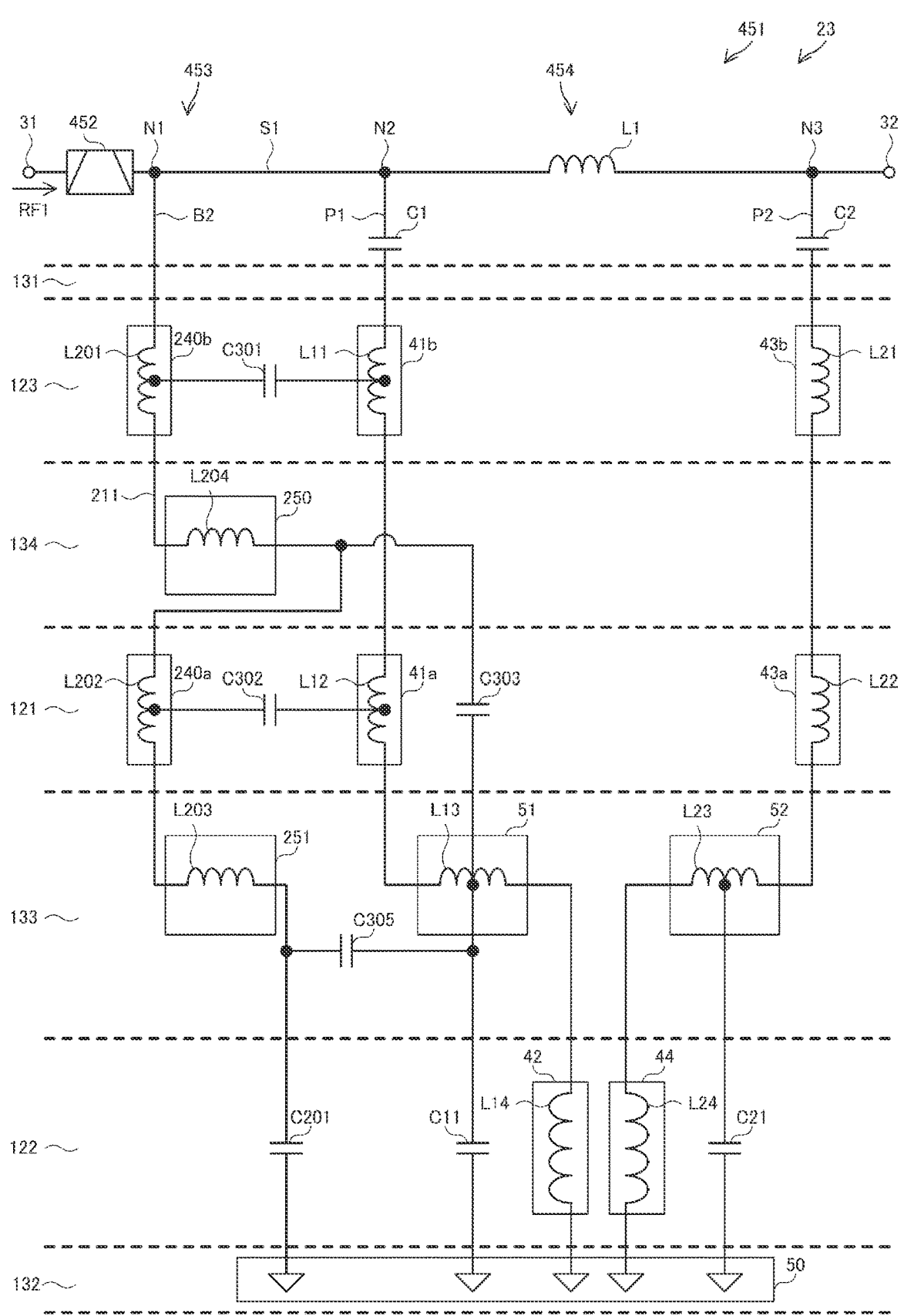
FIG. 12 is a circuit diagram of an equivalent circuit 23 of the filter device 13.

FIG. 12 is a circuit diagram of an equivalent circuit 23 of the filter device 13. The via 42 included in the parallel wire P1 and the via 44 included in the parallel wire P2 function as the inductors L14 and L24, respectively.

As depicted in FIG. 10 to FIG. 12, the electrodes 250 and 251 included in the branch wire B2 each has a small overall width in the x-axis direction, compared with the electrodes 250 and 251 of the filter device 11 depicted in FIGS. 4 and 5.

The second opposing portion 72a in the electrode 251 is opposed to the first opposing portion 71a in the electrode 51 in the same wiring layer 133 without necessarily having a conductor interposed therebetween. With this, the intralayer capacitor C305 is formed of the first opposing portion 71a in the electrode 51 and the second opposing portion 72a in the electrode 251 (refer to FIG. 12). On the other hand, since the electrode 251 is not opposed to the electrode 52, the intralayer capacitor C306 depicted in FIG. 6 is not formed.

The second opposing portion 72b in the electrode 250 is opposed to the first opposing portion 71b in the electrode 51 belonging to the different wiring layer 133 without necessarily having a conductor interposed therebetween. With this, the interlayer capacitor C303 is formed of the first opposing portion 71b in the electrode 51 and the second opposing portion 72a in the electrode 250 (refer to FIG. 12). On the other hand, since the electrode 250 is not opposed to the electrode 52, the interlayer capacitor C304 depicted in FIG. 6 is not formed.

Fourth Embodiment

Figure 13:
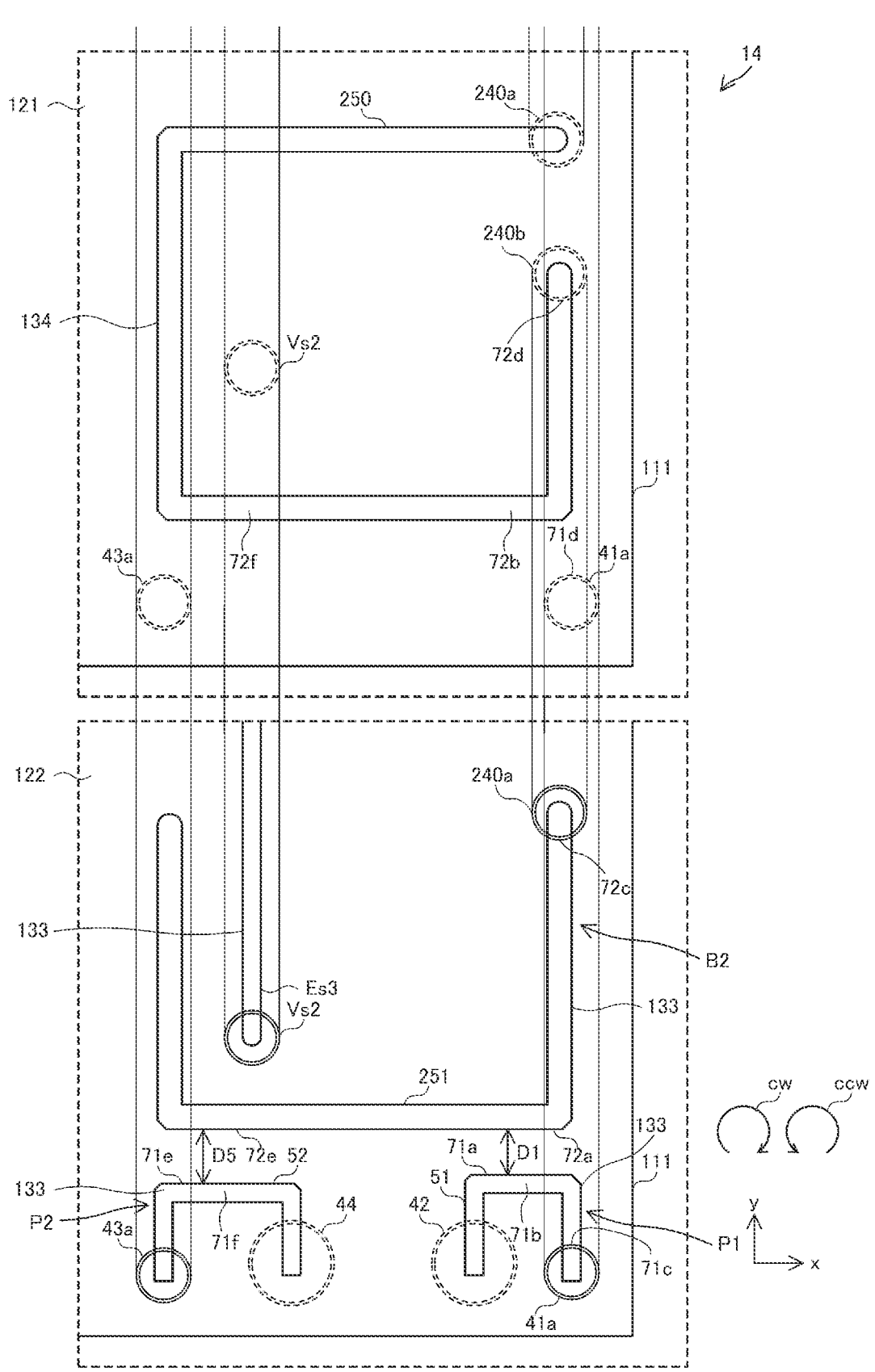
FIG. 13 is a view schematically depicting each section parallel to an xy plane of a filter device 14 where the filter circuit 451 is formed.

A filter device 14 according to a fourth embodiment is described. FIG. 13 is a view schematically depicting each section parallel to the xy plane of the filter device 14 where the filter circuit 451 is formed. Note that the way of viewing FIG. 13 is similar to that of FIG. 9.

As depicted in FIG. 13, the filter device 14 according to the fourth embodiment is different from the filter device 13 according to the third embodiment in that the overall width of the electrodes 250 and 251 in the y-axis direction is larger than the overall width of the electrodes 250 and 251 in the y-axis direction of the third embodiment.

Figure 14:
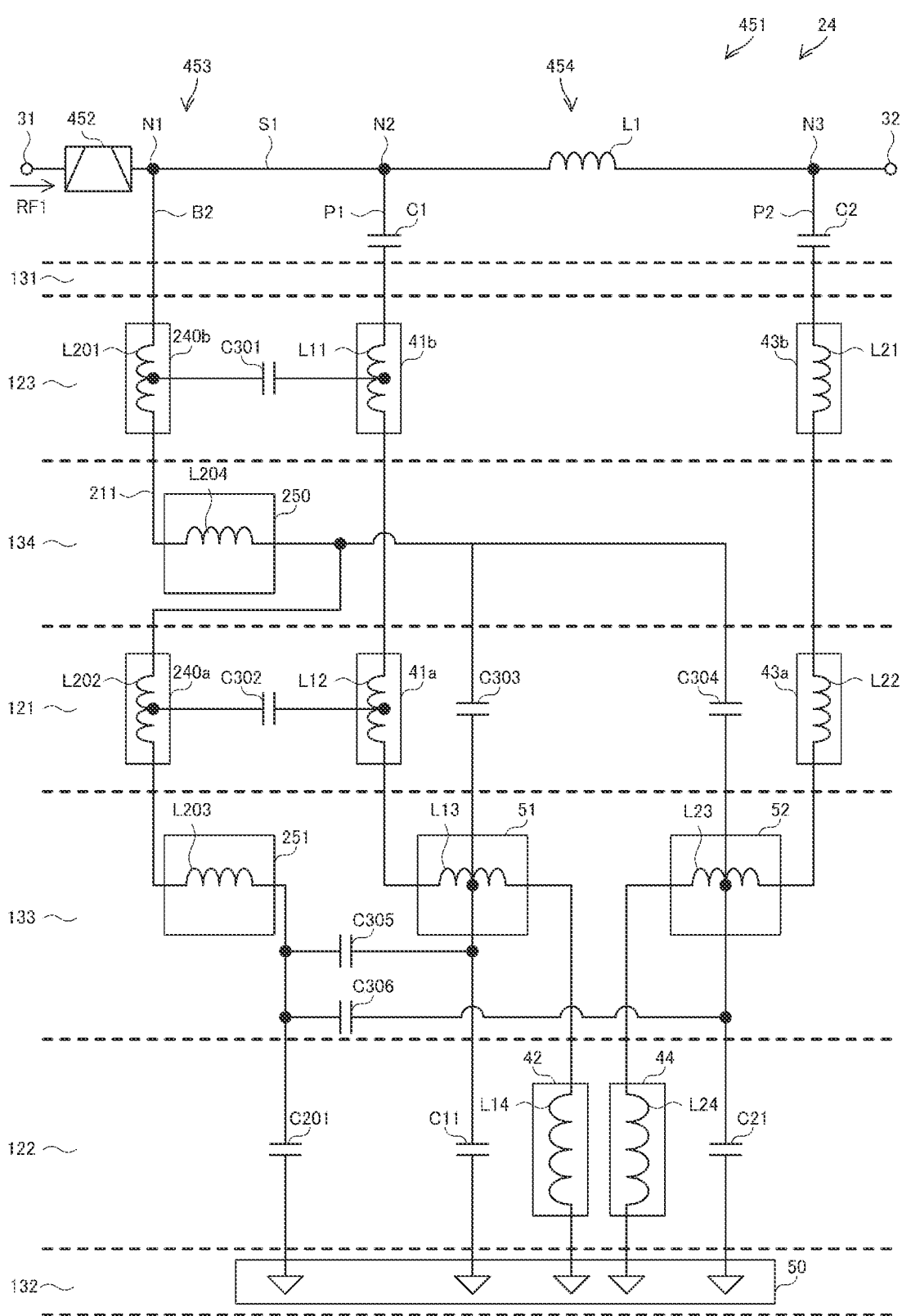
FIG. 14 is a circuit diagram of an equivalent circuit 24 of the filter device 14.

FIG. 14 is a circuit diagram of an equivalent circuit 24 of the filter device 14. As depicted in FIG. 13 and FIG. 14, a second opposing portion 72e in the electrode 251 is positioned on the x-axis–side with respect to the second opposing portion 72a and is opposed to a first opposing portion 71e in the electrode 52 in the same wiring layer 133 without necessarily having a conductor interposed therebetween. With this, the intralayer capacitor C306 is formed of the first opposing portion 71e in the electrode 52 and the second opposing portion 72e in the electrode 251 (refer to FIG. 14).

A second opposing portion 72f in the electrode 250 is positioned on the x-axis–side with respect to the second opposing portion 72b and is opposed to a first opposing portion 71f in the electrode 52 belonging to the different wiring layer 133 without necessarily having a conductor interposed therebetween. With this, the interlayer capacitor C304 is formed of the first opposing portion 71f in the electrode 52 and the second opposing portion 72f in the electrode 250 (refer to FIG. 14).

Fifth Embodiment

Figure 15:
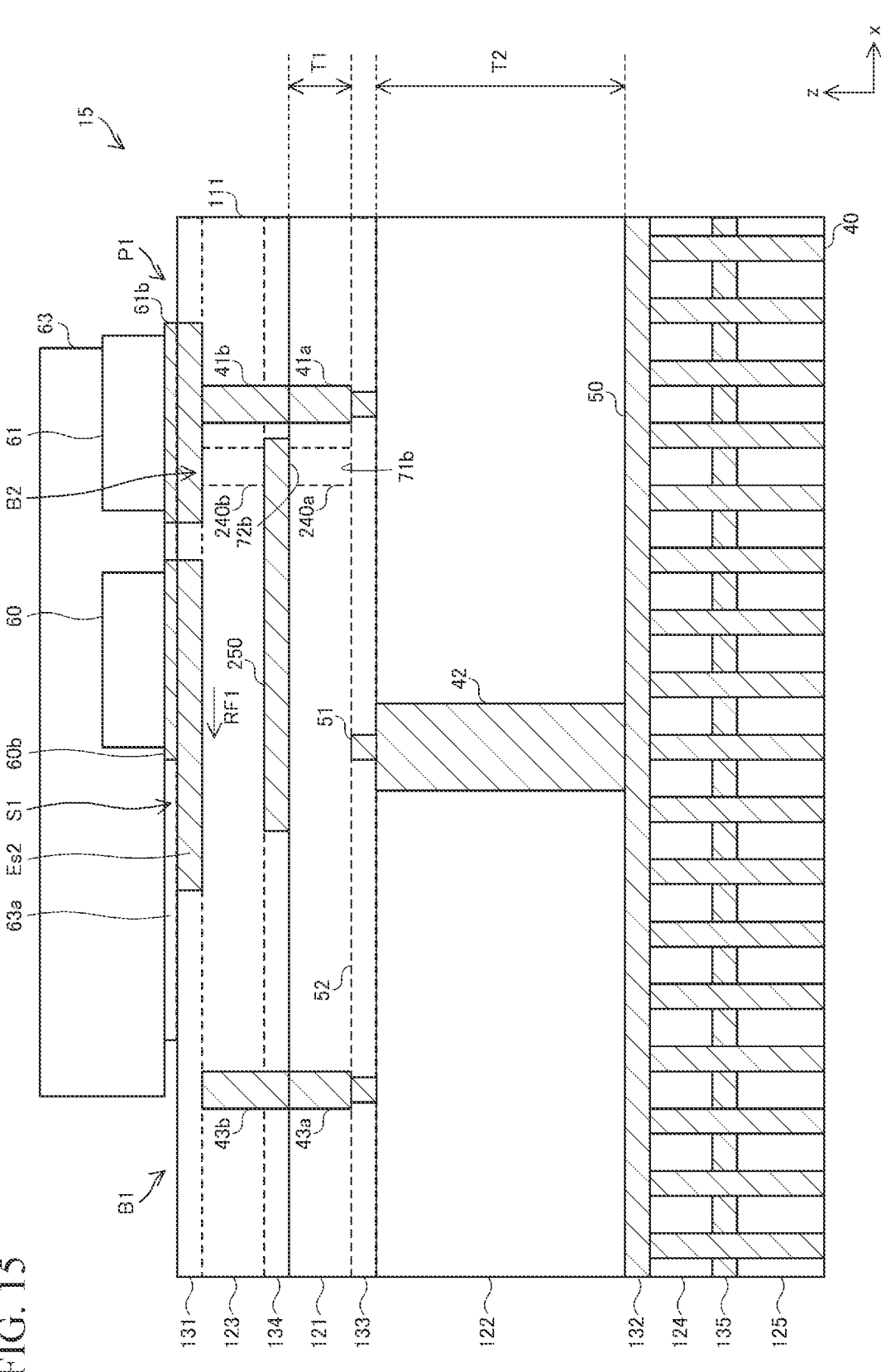
FIG. 15 is a view schematically depicting a section parallel to a zx plane of a filter device 15 where an L-shaped filter circuit is formed.

A filter device 15 according to a fifth embodiment is described. FIG. 15 is a view schematically depicting a section parallel to the zx plane of the filter device 15 where an L-shaped filter circuit is formed. As depicted in FIG. 15, the filter device 15 according to the fifth embodiment is different from the filter device 11 according to the first embodiment in that the parallel passive element 62 is not provided.

As depicted in FIG. 15, the parallel wire P1 is similar to the parallel wire P1 depicted in FIG. 3. A branch wire B1 includes the vias 43b and 43a and the electrode 52. The vias 43b and 43a and the electrode 52 depicted in FIG. 15 are similar to the vias 43b and 43a and the electrode 52, respectively, depicted in FIG. 3. Note in the branch wire B1 that the upper end portion of the via 43b is open.

Figure 16:
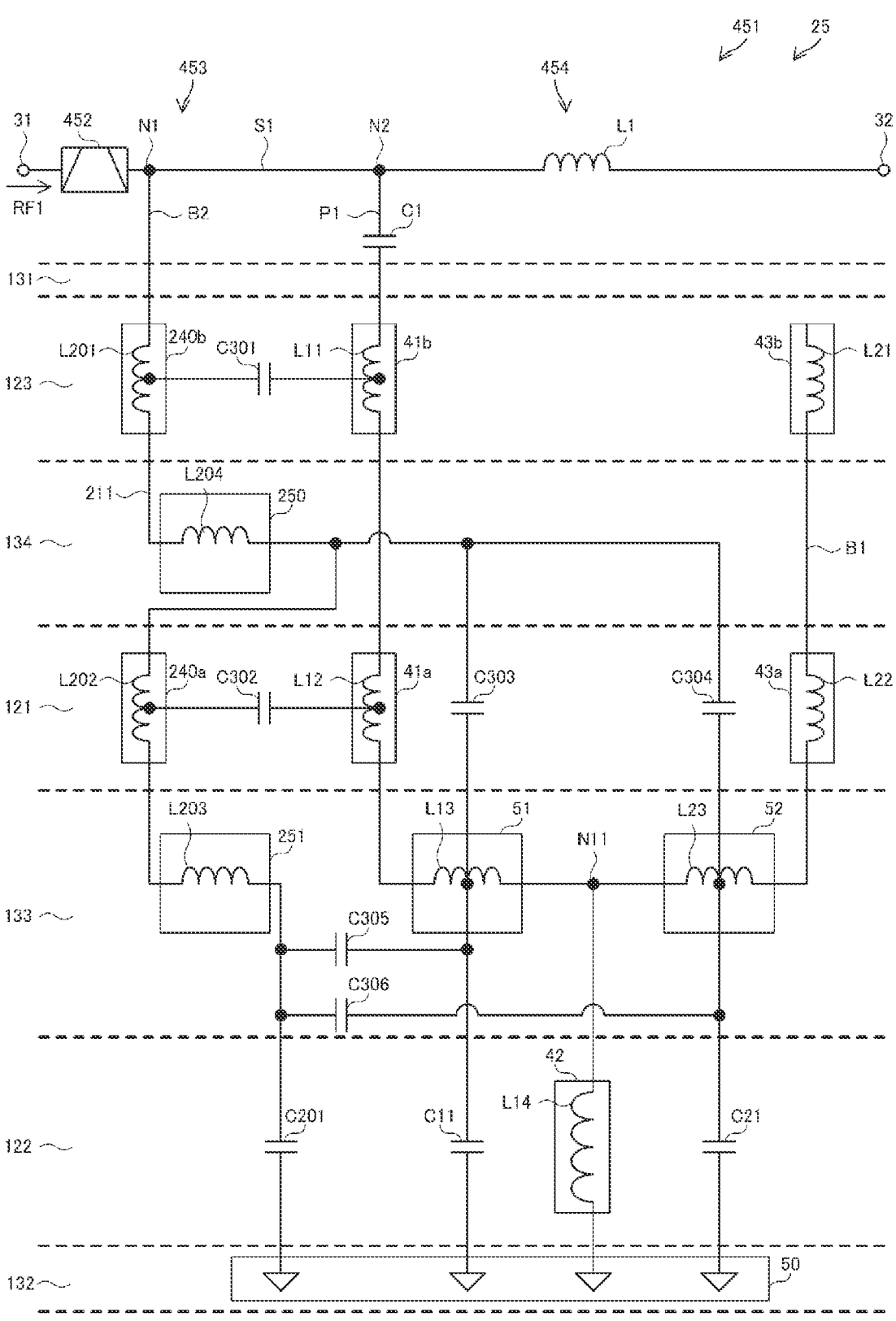
FIG. 16 is a circuit diagram of an equivalent circuit 25 of the filter device 15.

FIG. 16 is a circuit diagram of an equivalent circuit 25 of the filter device 15. As depicted in FIG. 16, compared with the equivalent circuit 21 depicted in FIG. 6, the equivalent circuit 25 is not provided with the capacitor C2. Therefore, the second end of the inductor L1 and the output terminal 32 and the inductor L21 are electrically insulated from each other.

More specifically, in the equivalent circuit 25, between the capacitor C1 and the ground, the inductors L11, L12, L13, and L14 are connected in series. Between the midpoint of the inductor L13 and the ground, the capacitor C11 is connected.

From a node N11 positioned between the inductor L13 and the inductor L14, the branch wire B1 is branched. In the branch wire B1, the inductor L23 has a first end connected to the node N11, and a second end. The inductor L21 has a first end connected to the second end of the inductor L23 through the inductor L22 and a second end as an open end. Between the midpoint of the inductor L23 and the ground, the capacitor C21 is connected.

As described above, since the second end of the inductor L21 is an open end, the branch wire B1 functions as an open stub circuit.

Note that while the structure has been described in the filter devices 11 to 14 in which the parallel wires P1 and P2 are provided, the structure is not limited to this. The structure may be such that either one of the parallel wires P1 and P2 is provided. Even this structure can achieve the object of the present application.

Also, while the structure has been described in the filter devices 11 to 14 in which the parallel wire P1 is branched from a portion between the input terminal 31 and the first end of the inductor L1 and the parallel wire P2 is branched from a portion between the output terminal 32 and the second end of the inductor L1, the structure is not limited to this. The structure may be such that the parallel wires P1 and P2 are branched from a portion between the input terminal 31 and the first end of the inductor L1 or such that the parallel wires P1 and P2 are branched from a portion between the output terminal 32 and the second end of the inductor L1.

Also, while the structure has been described in the filter devices 11 to 15 in which the dielectric layer 123 and the wiring layer 131 are provided between the series passive elements 60 and 63 and the parallel passive elements 61 and 62, and the dielectric layer 121, the structure is not limited to this. The structure may be such that the dielectric layer 123 and the wiring layer 131 are not provided and the series passive elements 60 and 63 and the parallel passive elements 61 and 62 are positioned on the upper surface of the wiring layer 134.

Also, while the structure has been described in the filter devices 11 to 15 in which the wiring layer 133 is provided between the dielectric layer 121 and the dielectric layer 122, the structure is not limited to this. The structure may be such that one or plurality of dielectric layers are provided between the dielectric layer 121 and the dielectric layer 122.

Also, while the structure has been described in the filter devices 11 to 15 in which the reference electrode 50 is connected to the ground, the structure is not limited to this.

The structure may be such that, for example, the reference electrode 50 is connected to a constant voltage source as a power supply for a power amplifier.

Also, while the structure has been described in the filter devices 11 to 15 in which the series passive elements 60 and 63 and the parallel passive elements 61 and 62 are each formed of an SMD, the structure is not limited to this. At least one of the series passive elements 60 and 63 and the parallel passive elements 61 and 62 may be formed of a wiring pattern provided on the multilayer board 111.

Also, while the structure has been described in the filter devices 11 to 15 in which the electrodes 51 and 52 are wound, the structure is not limited to this. The structure may be such that the electrodes 51 and 52 each has, for example, a linear shape, and are thereby not wound.

Also, while the structure has been described in the filter devices 11, 12, 14, and 15 in which the diameter of the via 41a and the diameter of the via 43a are smaller than the diameter of the via 42, the structure is not limited to this. The structure may be such that at least one of the diameter of the via 41a and the diameter of the via 43a is larger than the diameter of the via 42.

Also, while the structure has been described in the filter device 13 in which the diameter of the via 41a and the diameter of the via 43a are smaller than the diameter of the via 42 and the diameter of the via 44, respectively, the structure is not limited to this. The structure may be such that the diameter of the via 41a and the diameter of the via 43a are larger than the diameter of the via 42 and the diameter of the via 44, respectively.

Also, while the structure has been described in the filter devices 11 to 15 in which the electrodes 51 and 52 configuring the parallel wires P1 and P2 are formed on the wiring layer 133, the structure is not limited to this. The structure may be such that the electrodes 51 and 52 are formed on the wiring layer 134. In this case, an intralayer capacitor is formed between the electrodes 51 and 52 and the electrode 250. Also, an interlayer capacitor is formed between the electrodes 51 and 52 and the electrode 251.

Also, for example, while the structure has been described in the filter device 11 in which the vias 41a and 240a forming the capacitor C302 are provided in the same dielectric layer 121, the structure is not limited to this. The structure may be such that either one of the vias 41a and 240a is provided in another dielectric layer, such as the dielectric layer 122 or 123.

Also, in the specification, "the first opposing portion and the second opposing portion are opposed to each other without necessarily having a conductor interposed therebetween" refers to a relation in which one opposing portion is at a position where it can be seen through from the other opposing portion without necessarily having a conductor interposed therebetween. Specifically, for example, in the filter device 11 depicted in FIG. 2, the first opposing portion 71b and the second opposing portion 72b are not limited to a portion where the electrode 250 and the electrode 251 overlap each other when the multilayer board 111 is viewed in plan view along the laminating direction, but include the periphery of that portion. Also, when the multilayer board 111 is viewed in plan view along the laminating direction, even if a portion where the electrode 250 and the electrode 251 overlap each other is not present, portions that can form a capacitor between the electrode 250 and the electrode 251 are the first opposing portion and the second opposing portion.

In the foregoing, exemplarily embodiments of the present disclosure have been described. In the filter devices 11, 12, 13, 14, and 15, the multilayer board 111 includes the wiring layer 131 where the series wire S1 electrically connecting the input terminal 31 and the output terminal 32 together is provided, the wiring layer 132 including the reference electrode 50 to which a reference potential is supplied, the wiring layer 133 positioned between the wiring layer 131 and the wiring layer 132, the dielectric layer 121 positioned between the wiring layer 131 and the wiring layer 133, and the dielectric layer 122 positioned between the wiring layer 132 and the wiring layer 133. The series passive element 60 is provided to the series wire S1. The parallel wire P1 electrically connects the series wire S1 and the reference electrode 50. The parallel passive element 61 is provided to the parallel wire P1. The open stub 211 is the open stub 211 at least partially provided to the wiring layer 133 and has one end connected to the series wire S1 and another end that is opened. The parallel wire P1 and the open stub 211 include a first opposing portion and a second opposing portion, respectively, that are opposed to each other without necessarily having a conductor interposed therebetween.

With this structure, the filter devices 11, 12, 13, 14, and 15 having attenuation characteristics by the open stub 211 and attenuation characteristics by the filter circuit including the series passive element 60 and the parallel passive element 61 can be achieved. And, to avoid formation of parasitic capacitance, in conventional technologies, the parallel wire P1 and the open stub 211 are provided so as to be away from each other. By contrast, with the structure in which the parallel wire P1 and the open stub 211 are arranged so as to be close to each other and the capacitors C301 to C306 are formed of the first opposing portion included in the parallel wire P1 and the second opposing portion included in the open stub 211, the capacitors C301 to C306 and the resonant circuit including the series passive element 60 and the parallel passive element 61 can be achieved without necessarily newly providing a reactance element. By this resonant circuit, a new pole can be generated in the attenuation characteristics. Thus, for example, the attenuation in the harmonic frequency band can be increased. Therefore, a filter device capable of suppressing degradation in filter characteristics can be provided.

Also, in the filter devices 11, 12, 14, and 15, the parallel wire P1 is provided to the wiring layer 133 and includes the electrodes 51 and 52 at least part of which are the first opposing portion 71a. And the open stub 211 is provided to the wiring layer 133 and includes a second electrode 251 at least part of which is the second opposing portion 72a.

With this structure, the intralayer capacitors C305 and C306 having a desired electrostatic capacity can be formed by a simple method of adjusting the pattern such as the electrode distance between electrodes belonging to the wiring layer 133 and the lengths of the electrodes.

Also, in the filter devices 11, 12, 14, and 15, the multilayer board 111 further includes the wiring layer 134 positioned between the wiring layer 131 and the wiring layer 132 and the dielectric layer 123 positioned between the wiring layer 131 and the wiring layer 134. The parallel wire P1 includes the electrodes 51 and 52 provided to the wiring layer 133. The open stub 211 includes the electrode 250 provided to the wiring layer 134. And a first portion that is at least part of the electrodes 51 and 52 and a second portion that is at least part of the electrode 250 are the first opposing portion 71b and the second opposing portion 72b, respectively, that are opposed to each other.

With this structure, the interlayer capacitors C303 and C304 having a desired electrostatic capacity can be formed by a simple method of adjusting the pattern of the wiring layer 133, the pattern of the wiring layer 134, and the thickness of the dielectric layer 121.

Also, in the filter devices 11, 12, 13, 14, and 15, when the multilayer board 111 is viewed in plan view along the laminating direction, there is a portion where the first portion and the second portion overlap each other.

As described above, by providing the structure in which a portion where the first portion and the second portion overlap each other and which has the smallest distance between conductors, the electrostatic capacity can be increased with ease.

Also, in the filter devices 11, 12, 14, and 15, the open stub 211 further includes the electrode 251 provided to the wiring layer 133. A third portion that is at least part of the electrodes 51 and 52 and a fourth portion that is at least part of the electrode 251 are the first opposing portion 71a and the second opposing portion 72a, respectively, that are opposed to each other. And the combined capacitance of the interlayer capacitors C303 and 304 formed of the first portion and the second portion and the combined capacitance of the intralayer capacitors C305 and C306 formed of the third portion and the fourth portion are substantially equal.

With this structure, the frequency of the pole by the resonant circuit including the interlayer capacitors C303 and C304 and the frequency of the pole by the resonant circuit including the intralayer capacitors C305 and C306 can be made substantially equal. Thus, the attenuation of the signal RF1 in that frequency can be increased.

Also, in the filter devices 11, 12, 14, and 15, the open stub 211 further includes the electrode 251 provided to the wiring layer 133. A third portion that is at least part of the electrodes 51 and 52 and a fourth portion that is at least part of the electrode 251 are the first opposing portion 71a and the second opposing portion 72a, respectively, that are opposed to each other. And the combined capacitance of the interlayer capacitors C303 and C304 formed of the first portion and the second portion and the capacitance of the intralayer capacitors C305 and C306 formed of the third portion and the fourth portion are different.

With this structure, the frequency of the pole by the resonant circuit including the interlayer capacitors C303 and C304 and the frequency of the pole by the resonant circuit including the intralayer capacitors C305 and C306 can be shifted. Thus, a wide-band attenuation band can be generated.

Also, in the filter devices 11, 12, 13, 14, and 15, the parallel wire P1 includes the via 41a which penetrates through the dielectric layer 121 or 122 and electrically connects the parallel passive element 61 and the reference electrode 50 together, at least part of the via 41a being the first opposing portion 71c. And the open stub 211 includes the via 240a which penetrates through the dielectric layer 121 or 122 and at least part of which is the second opposing portion 72c.

With this structure, the intralayer capacitor C302 having a desired electrostatic capacity can be formed by a simple method of adjusting the distance between the via 41a and the via 240a and the thickness of the dielectric layer 121.

Also, in the filter devices 11, 12, 13, 14, and 15, when the multilayer board 111 is viewed in plan view along a laminating direction, the reference electrode 50 and the open stub 211 overlap each other.

With this structure, in attenuation characteristics, a pole by the open stub 211 can be formed. Furthermore, a pole by a resonant circuit including the capacitor C201 formed of the reference electrode 50 and the open stub 211 can be formed.

With this, attenuation characteristics with large attenuation and attenuation band can be achieved.

Also, in the filter devices 11, 12, 13, 14, and 15, the parallel wire P1 includes the via 41a which penetrates through the dielectric layer 121 and is electrically connected to the parallel passive element 61 and the via 42 which penetrates through the dielectric layer 122 and electrically connects the via 41a and the reference electrode 50 together. And the cross-sectional area of the via 41a and the cross-sectional area of the via 42 are different.

As described above, with the structure in which the cross-sectional area of the via 41a and the cross-sectional area of the via 42 are different, the parasitic inductance of the via 41a and the parasitic inductance of the via 42 can be made different from each other. That is, in the multilayer board 111 formed to have the appropriately-designed cross-sectional area of the via 41a and cross-sectional area of the via 42, the parasitic inductance of the via 41a and the parasitic inductance of the via 42 can be taken as adjustable circuit elements in the filter circuit 451. Thus, the degree of flexibility in adjustment of filter characteristics can be enhanced. With this, degradation in filter characteristics can be effectively suppressed while the size is decreased.

Note that each embodiment described above is to facilitate understanding of the present disclosure and is not to limit the present disclosure for interpretation. The present disclosure can be changed/improved without necessarily deviating from the gist of the disclosure, and also includes its equivalents. That is, those obtained by a person skilled in the art making a design change as appropriate on each embodiment are also included in the scope of the present disclosure as long as those include the features of the present disclosure. For example, the elements included in each embodiment and their arrangements, materials, conditions, shapes, sizes, and so forth are not limited to those exemplarily described, and can be changed as appropriate. Also, each embodiment is merely an example and, needless to say, partial replacement or combination of the structures described in different embodiments can be made, and these are also included in the scope of the present disclosure as long as they include the features of the present disclosure.

What is claimed is:

1. A filter device comprising:
   a multilayer board comprising:
      a first wiring layer comprising a series wire that electrically connects a first terminal and a second terminal,
      a second wiring layer comprising a reference electrode having a reference potential,
      a third wiring layer between the first wiring layer and the second wiring layer,
      a first dielectric layer between the first wiring layer and the third wiring layer, and
      a second dielectric layer between the second wiring layer and the third wiring layer;
   a series passive circuit element electrically connected to the series wire;
   a parallel wire that electrically connects the series wire and the reference electrode;
   a parallel passive circuit element electrically connected to the parallel wire; and
   an open stub at least partially electrically connected to the third wiring layer, and having a first end connected to the series wire and a second end that is open,
   wherein the parallel wire and the open stub have a first opposing portion and a second opposing portion, respectively, that are opposed to each other without having a conductor interposed therebetween, wherein the multilayer board further comprises:

a fourth wiring layer between the first wiring layer and the second wiring layer; and a third dielectric layer between the first wiring layer and the fourth wiring layer, wherein the parallel wire comprises a first electrode electrically connected to the third wiring layer, wherein the open stub comprises a third electrode electrically connected to the fourth wiring layer, wherein a first portion of the first electrode and a second portion of the third electrode are the first opposing portion and the second opposing portion, respectively, wherein the open stub further comprises a second electrode electrically connected to the third wiring layer, wherein a third portion of the first electrode and a fourth portion of the second electrode are constituted by the first opposing portion and the second opposing portion, respectively, and wherein a capacitance of a capacitor formed by the first portion and the second portion is equal to a capacitance of a capacitor formed by the third portion and the fourth portion.

2. The filter device according to claim 1, wherein the parallel wire comprises a first via which penetrates through the first dielectric layer or the second dielectric layer, and that electrically connects the parallel passive circuit element and the reference electrode together, at least part of the first via being the first opposing portion, and wherein the open stub comprises a second via which penetrates through the first dielectric layer or the second dielectric layer, and at least part of which is the second opposing portion.

3. The filter device according to claim 1, wherein the reference electrode and the open stub overlap each other in a plan view of the multilayer board along a laminating direction.

4. A filter device comprising:

a multilayer board comprising:

a first wiring layer comprising a series wire that electrically connects a first terminal and a second terminal, a second wiring layer comprising a reference electrode having a reference potential, a third wiring layer between the first wiring layer and the second wiring layer, a first dielectric layer between the first wiring layer and the third wiring layer, and a second dielectric layer between the second wiring layer and the third wiring layer;

a series passive circuit element electrically connected to the series wire;

a parallel wire that electrically connects the series wire and the reference electrode;

a parallel passive circuit element electrically connected to the parallel wire; and an open stub at least partially electrically connected to the third wiring layer, and having a first end connected to the series wire and a second end that is open, wherein the parallel wire and the open stub have a first opposing portion and a second opposing portion, respectively, that are opposed to each other without having a conductor interposed therebetween, wherein the parallel wire comprises:

a first via which penetrates through the first dielectric layer, and is electrically connected to the parallel passive circuit element, and a second via which penetrates through the second dielectric layer, and electrically connects the first via and the reference electrode together, and wherein a cross-sectional area of the first via is different than a cross-sectional area of the second via.

5. A filter device comprising:

a multilayer board comprising:

a first wiring layer comprising a series wire that electrically connects a first terminal and a second terminal, a second wiring layer comprising a reference electrode having a reference potential, a third wiring layer between the first wiring layer and the second wiring layer a first dielectric layer between the first wiring layer and the third wiring layer, and a second dielectric layer between the second wiring layer and the third wiring layer;

a series passive circuit element electrically connected to the series wire;

a parallel wire that electrically connects the series wire and the reference electrode;

a parallel passive circuit element electrically connected to the parallel wire; and an open stub at least partially electrically connected to the third wiring layer, and having a first end connected to the series wire and a second end that is open, wherein the parallel wire and the open stub have a first opposing portion and a second opposing portion, respectively, that are opposed to each other without having a conductor interposed therebetween, wherein the multilayer board further comprises:

a fourth wiring layer between the first wiring layer and the second wiring layer, and a third dielectric layer between the first wiring layer and the fourth wiring layer, wherein the parallel wire comprises a first electrode electrically connected to the third wiring layer, wherein the open stub comprises a third electrode electrically connected to the fourth wiring layer, wherein a first portion of the first electrode and a second portion of the third electrode are the first opposing portion and the second opposing portion, respectively, wherein the open stub further comprises a second electrode electrically connected to the third wiring layer, a third portion of the first electrode and a fourth portion of the second electrode are constituted by the first opposing portion and the second opposing portion, respectively, and a capacitance of a capacitor formed by the first portion and the second portion is different than a capacitance of a capacitor formed by the third portion and the fourth portion.

6. A filter device comprising:

a multilayer board comprising:

a first wiring layer comprising a series wire that electrically connects a first terminal and a second terminal, a second wiring layer comprising a reference electrode having a reference potential, a third wiring layer between the first wiring layer and the second wiring layer, a first dielectric layer between the first wiring layer and the third wiring layer, and a second dielectric layer between the second wiring layer and the third wiring layer;

a series passive circuit element electrically connected to the series wire;

a parallel wire that electrically connects the series wire and the reference electrode;

a parallel passive circuit element electrically connected to the parallel wire; and an open stub at least partially electrically connected to the third wiring layer, and having a first end connected to the series wire and a second end that is open, wherein the parallel wire and the open stub have a first opposing portion and a second opposing portion, respectively, that are opposed to each other without having a conductor interposed therebetween, wherein the parallel wire comprises a first via which penetrates through the first dielectric layer or the second dielectric layer, and that electrically connects the parallel passive circuit element and the reference electrode together, at least part of the first via being the first opposing portion, and wherein the open stub comprises a second via which penetrates through the first dielectric layer or the second dielectric layer, and at least part of which is the second opposing portion.

* * * * *